(12) United States Patent
Cao et al.

(10) Patent No.: US 10,641,911 B2
(45) Date of Patent: May 5, 2020

(54) PACKAGING METHODS OF SEMICONDUCTOR X-RAY DETECTORS

(71) Applicant: SHENZHEN XPECTVISION TECHNOLOGY CO., LTD., Shenzhen (CN)

(72) Inventors: Peiyan Cao, Shenzhen (CN); Yurun Liu, Shenzhen (CN)

(73) Assignee: SHENZHEN XPECTVISION TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 15/737,802

(22) PCT Filed: Dec. 2, 2015

(86) PCT No.: PCT/CN2015/096192
§ 371 (c)(1),
(2) Date: Dec. 19, 2017

(87) PCT Pub. No.: WO2017/091989
PCT Pub. Date: Jun. 8, 2017

(65) Prior Publication Data
US 2019/0004191 A1    Jan. 3, 2019

(51) Int. Cl.
*H01L 27/146* (2006.01)
*G01T 1/24* (2006.01)
(Continued)

(52) U.S. Cl.
CPC ............... *G01T 1/244* (2013.01); *G01T 1/24* (2013.01); *G01T 1/247* (2013.01);
(Continued)

(58) Field of Classification Search
CPC ........... H01L 27/1469; H01L 23/49838; H01L 23/66; H01L 27/14618; H01L 27/14663;
(Continued)

(56) References Cited

U.S. PATENT DOCUMENTS 7,223,981 B1   5/2007  Capote et al.
10,007,007 B2*  6/2018  Cao .................. H01L 27/14609
(Continued)

FOREIGN PATENT DOCUMENTS

CN     1729579 A    2/2006
CN   101903802 B    9/2013
(Continued)

OTHER PUBLICATIONS

R. Guerre et al: "Selective Transfer Technology for Microdevice Distribution", Journal of Microelectromechanical Systems., vol. 17, No. 1, Feb. 1, 2008 (Feb. 1, 2008), pp. 157-165, XP055556153, US, ISSN: 1057-7157, DOI: 10.1109/JMEMS.2007.911370.

*Primary Examiner* — Thanh Y. Tran
(74) *Attorney, Agent, or Firm* — IPro, PLLC; Qian Gu

(57) ABSTRACT

Disclosed herein is a method for making an apparatus suitable for detecting X-ray, the method comprising: bonding a plurality of chips to a substrate; wherein the substrate comprises an X-ray absorption layer comprising a first plurality of electrical contacts; wherein each of the plurality of chips comprises an electronic layer comprising a second plurality of electrical contacts and an electronic system configured to process or interpret signals generated by X-ray photons incident on the X-ray absorption layer; aligning the first plurality of electrical contacts to the second plurality of electrical contacts; mounting the chips to the substrate such that the first plurality of electrical contacts are electrically connected to the second plurality of electrical contacts; wherein the second plurality of electrical contacts are configured to feed the signals to the electronic system.

19 Claims, 45 Drawing Sheets

(51) Int. Cl.
*H01L 23/498* (2006.01)
*H01L 23/66* (2006.01)
(52) U.S. Cl.
CPC ........ *H01L 23/49838* (2013.01); *H01L 23/66* (2013.01); *H01L 27/1469* (2013.01); *H01L 27/14618* (2013.01); *H01L 27/14636* (2013.01); *H01L 27/14661* (2013.01); *H01L 27/14663* (2013.01); *H01L 2224/48091* (2013.01)
(58) Field of Classification Search
CPC ..... H01L 27/14636; H01L 2224/48091; G01T 1/244; G01T 1/247; G01T 1/24
See application file for complete search history.

(56) References Cited

U.S. PATENT DOCUMENTS

| | | | |
|---|---|---|---|
| 2004/0209453 A1 | 10/2004 | Akamatsu et al. | |
| 2008/0070345 A1* | 3/2008 | Lin | H01L 21/563 438/107 |
| 2015/0132950 A1* | 5/2015 | Jung | H01L 24/96 438/667 |
| 2018/0226330 A1* | 8/2018 | Kim | H01L 23/13 |
| 2019/0035831 A1* | 1/2019 | Cao | H01L 27/14659 |

FOREIGN PATENT DOCUMENTS

| | | |
|---|---|---|
| CN | 102460215 B | 2/2014 |
| CN | 103917897 B | 8/2016 |
| JP | 2005026419 A | 1/2005 |
| WO | 2007006836 A1 | 1/2007 |

\* cited by examiner

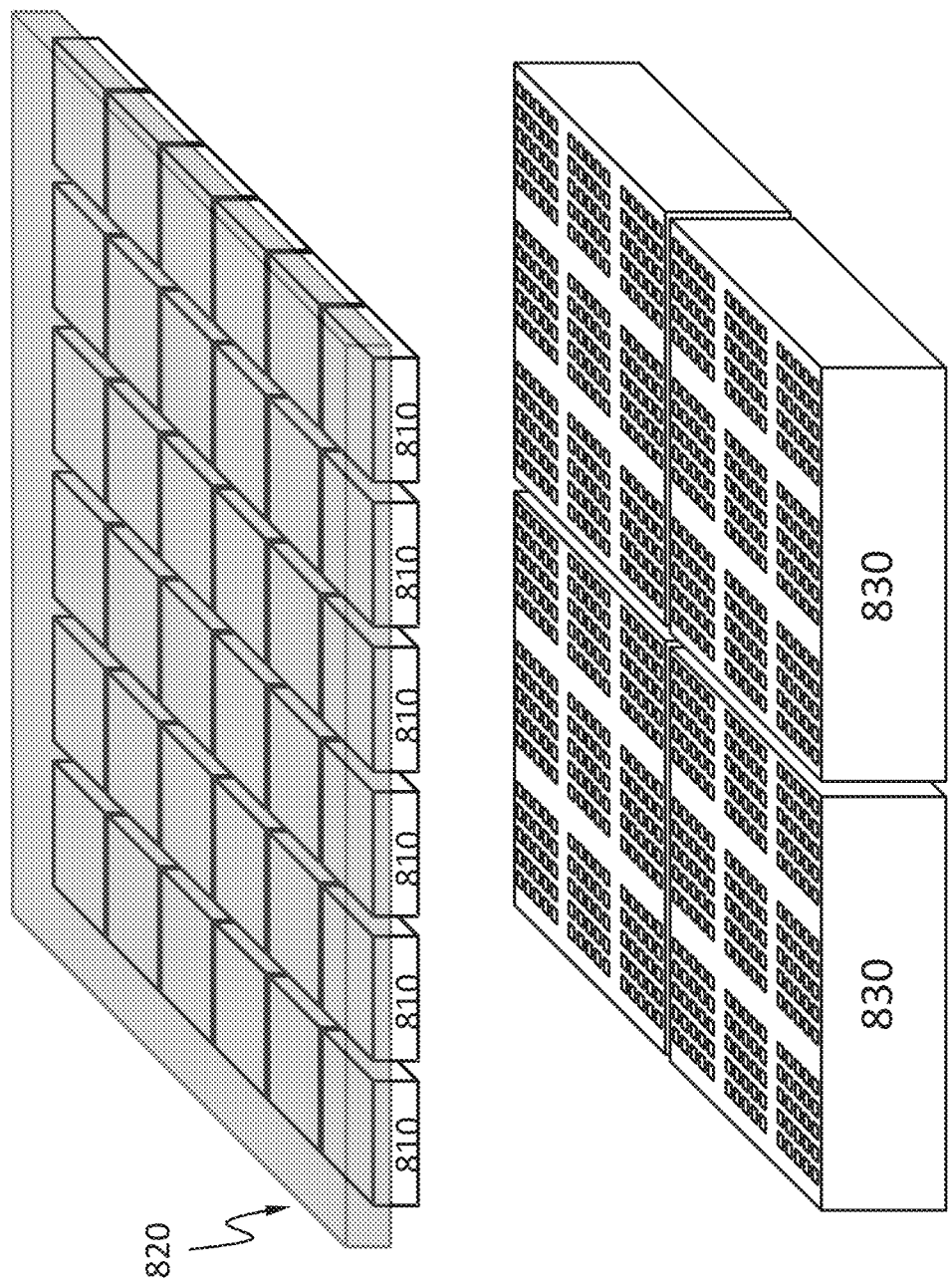

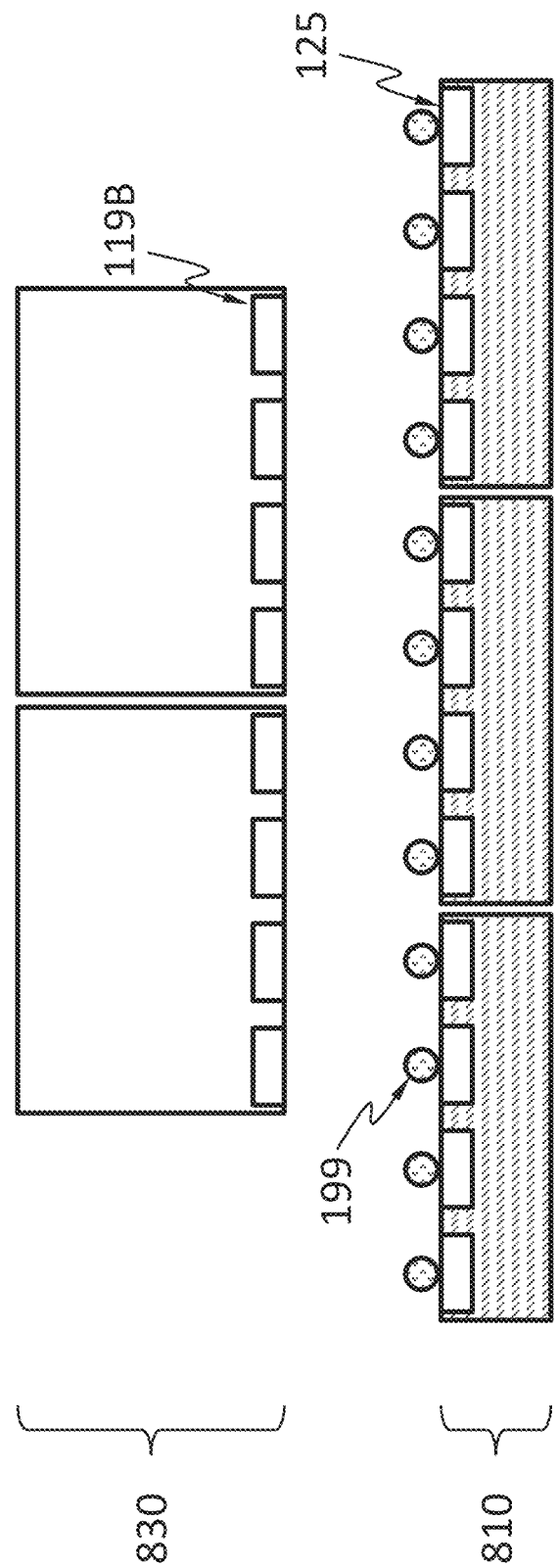

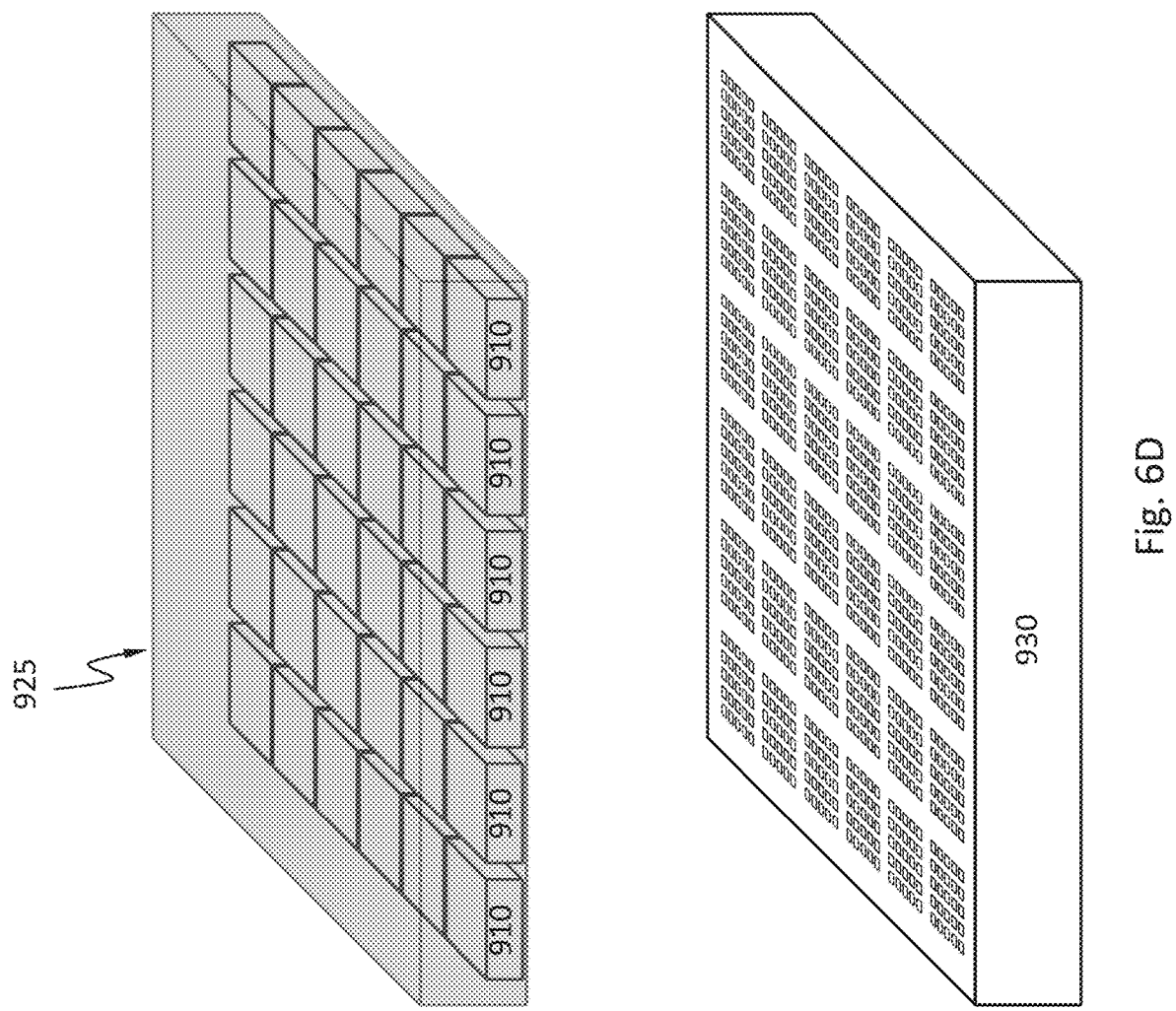

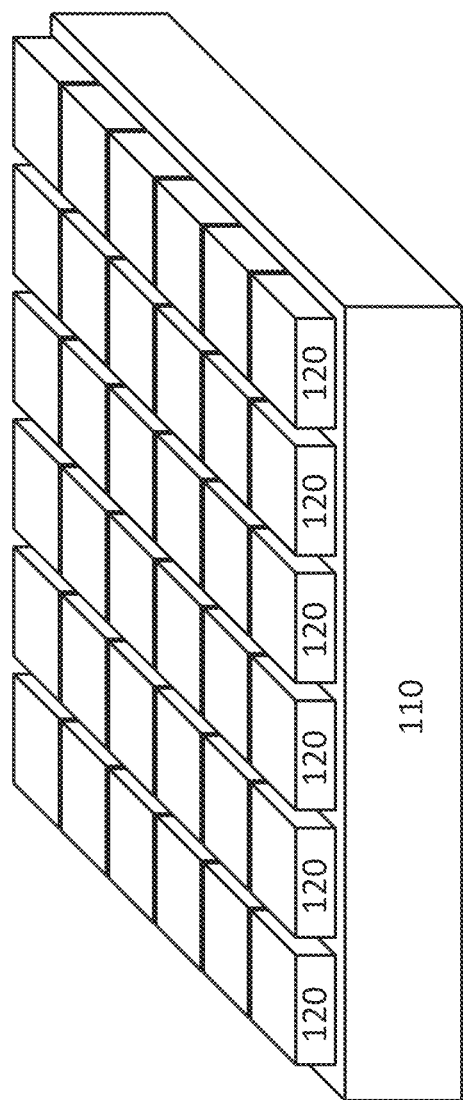

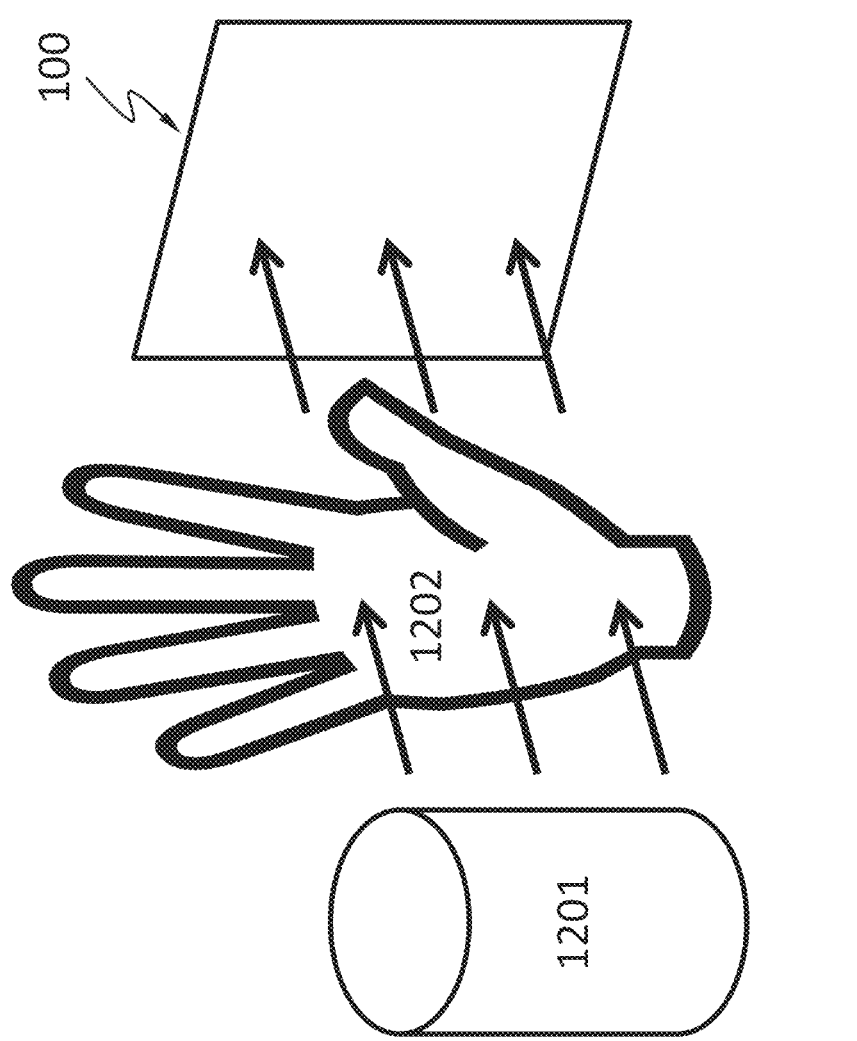

PACKAGING METHODS OF SEMICONDUCTOR X-RAY DETECTORS

TECHNICAL FIELD

The disclosure herein relates to X-ray detectors, particularly relates to methods of packaging semiconductor X-ray detectors.

BACKGROUND

X-ray detectors may be devices used to measure the flux, spatial distribution, spectrum or other properties of X-rays.

X-ray detectors may be used for many applications. One important application is imaging. X-ray imaging is a radiography technique and can be used to reveal the internal structure of a non-uniformly composed and opaque object such as the human body.

Early X-ray detectors for imaging include photographic plates and photographic films. A photographic plate may be a glass plate with a coating of light-sensitive emulsion. Although photographic plates were replaced by photographic films, they may still be used in special situations due to the superior quality they offer and their extreme stability. A photographic film may be a plastic film (e.g., a strip or sheet) with a coating of light-sensitive emulsion.

In the 1980s, photostimulable phosphor plates (PSP plates) became available. A PSP plate may contain a phosphor material with color centers in its lattice. When the PSP plate is exposed to X-ray, electrons excited by X-ray are trapped in the color centers until they are stimulated by a laser beam scanning over the plate surface. As the plate is scanned by laser, trapped excited electrons give off light, which is collected by a photo multiplier tube. The collected light is converted into a digital image. In contrast to photographic plates and photographic films, PSP plates can be reused.

Another kind of X-ray detectors are X-ray image intensifiers. Components of an X-ray image intensifier are usually sealed in a vacuum. In contrast to photographic plates, photographic films, and PSP plates, X-ray image intensifiers may produce real-time images, i.e., do not require post-exposure processing to produce images. X-ray first hits an input phosphor (e.g., cesium iodide) and is converted to visible light. The visible light then hits a photocathode (e.g., a thin metal layer containing cesium and antimony compounds) and causes emission of electrons. The number of emitted electrons is proportional to the intensity of the incident X-ray. The emitted electrons are projected, through electron optics, onto an output phosphor and cause the output phosphor to produce a visible-light image.

Scintillators operate somewhat similarly to X-ray image intensifiers in that scintillators (e.g., sodium iodide) absorb X-ray and emit visible light, which can then be detected by a suitable image sensor for visible light. In scintillators, the visible light spreads and scatters in all directions and thus reduces spatial resolution. Reducing the scintillator thickness helps to improve the spatial resolution but also reduces absorption of X-ray. A scintillator thus has to strike a compromise between absorption efficiency and resolution.

Semiconductor X-ray detectors largely overcome this problem by direct conversion of X-ray into electric signals. A semiconductor X-ray detector may include a semiconductor layer that absorbs X-ray in wavelengths of interest. When an X-ray photon is absorbed in the semiconductor layer, multiple charge carriers (e.g., electrons and holes) are generated and swept under an electric field towards electrical contacts on the semiconductor layer. Cumbersome heat management required in currently available semiconductor X-ray detectors (e.g., Medipix) can make a detector with a large area and a large number of pixels difficult or impossible to produce.

SUMMARY

Disclosed herein is a method for making an apparatus suitable for detecting X-ray, the method comprising: bonding a plurality of chips to a substrate; wherein the substrate comprises an X-ray absorption layer comprising a first plurality of electrical contacts; wherein each of the plurality of chips comprises an electronic layer comprising a second plurality of electrical contacts and an electronic system configured to process or interpret signals generated by X-ray photons incident on the X-ray absorption layer; aligning the first plurality of electrical contacts to the second plurality of electrical contacts; mounting the chips to the substrate such that the first plurality of electrical contacts are electrically connected to the second plurality of electrical contacts; wherein the second plurality of electrical contacts are configured to feed the signals to the electronic system.

According to an embodiment, the method further comprises attaching the plurality of chips to a support wafer.

According to an embodiment, the plurality of chips are attached to the support wafer with an adhesive.

According to an embodiment, the plurality of chips are attached to the support wafer after the plurality of chips are mounted to the substrate.

According to an embodiment, the plurality of chips are mounted to a second substrate.

According to an embodiment, the method further comprises removing the support wafer.

According to an embodiment, removing the support wafer comprises grinding or etching the support wafer.

According to an embodiment, the method further comprises encapsulating the plurality of chips in a matrix.

According to an embodiment, the matrix comprises a polymer or glass.

According to an embodiment, the matrix fills gaps between the chips.

According to an embodiment, the method further comprises exposing a surface of each of the chips.

According to an embodiment, mounting the chips to the substrate comprises mounting the chips encapsulated in the matrix.

According to an embodiment, the electronic layer comprises vias extending to a surface opposite to the X-ray absorption layer.

According to an embodiment, the method further comprises aligning the vias to contact pads on an interposer substrate, and bonding the chips to the interposer substrate such that the vias are electrically connected to the contact pads.

According to an embodiment, the interposer substrate comprises transmission lines electrically connected to the contact pads and configured to route a signal on the contact pads to bonding pads on an edge of the interposer substrate.

According to an embodiment, the method further comprises counting the interposer substrate to a printed circuit board or positioning the interposer substrate side-by-side with a printed circuit board.

According to an embodiment, the electronic layer comprises a third plurality of electrical contacts configured to read output from the electronic system or to provide power or a reference voltage to the electronic system.

According to an embodiment, the X-ray absorption layer comprises a fourth plurality of electrical contacts configured to connect with the third electrical contacts when the chips are mounted to the substrate.

According to an embodiment, the X-ray absorption layer further comprises transmission lines configured to route a signal at the fourth plurality of electrical contacts to bonding pads on the X-ray absorption layer.

BRIEF DESCRIPTION OF FIGURES

FIG. 5A-FIG. 5F schematically show a process of mounting a plurality of chips onto a substrate, according to an embodiment.

FIG. 6A-FIG. 6E schematically show a process of mounting a plurality of chips onto a substrate, according to an embodiment.

FIG. 8A-FIG. 8E schematically show a process of mounting a plurality of chips onto a substrate, according to an embodiment.

FIG. 9 schematically shows a system comprising the semiconductor X-ray detector described herein, suitable for medical imaging such as chest X-ray radiography, abdominal X-ray radiography, etc., according to an embodiment FIG. 10 schematically shows a system comprising the semiconductor X-ray detector described herein suitable for dental X-ray radiography, according to an embodiment.

DETAILED DESCRIPTION

Figure 1A:
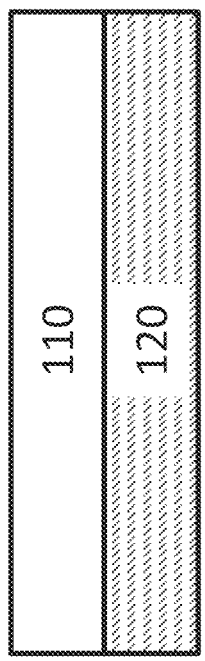
FIG. 1A schematically shows a cross-sectional view of the detector, according to an embodiment.

FIG. 1A schematically shows a cross-sectional view of the detector 100, according to an embodiment. The detector 100 may include an X-ray absorption layer 110 and an electronics layer 120 (e.g., an ASIC) for processing or analyzing electrical signals incident X-ray generates in the X-ray absorption layer 110. In an embodiment, the detector 100 does not comprise a scintillator. The X-ray absorption layer 110 may include a semiconductor material such as, silicon, germanium, GaAs, CdTe, CdZnTe, or a combination thereof. The semiconductor may have a high mass attenuation coefficient for the X-ray energy of interest.

Figure 1B:
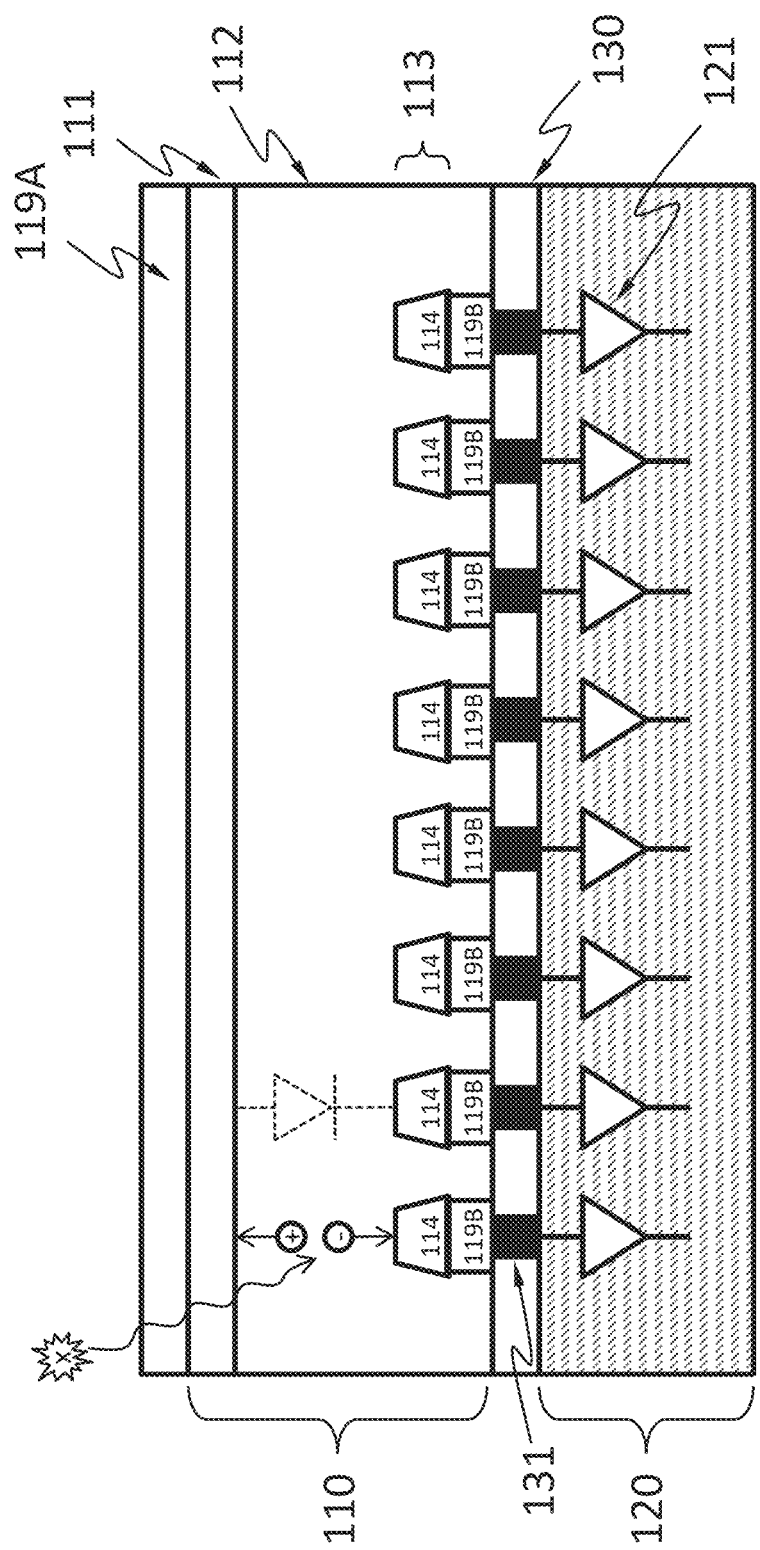
FIG. 1B schematically shows a detailed cross-sectional view of the detector, according to an embodiment.

As shown in a detailed cross-sectional view of the detector 100 in FIG. 1B, according to an embodiment, the X-ray absorption layer 110 may include one or more diodes (e.g., p-i-n or p-n) formed by a first doped region 111, one or more discrete regions 114 of a second doped region 113. The second doped region 113 may be separated from the first doped region 111 by an optional the intrinsic region 112. The discrete portions 114 are separated from one another by the first doped region 111 or the intrinsic region 112. The first doped region 111 and the second doped region 113 have opposite types of doping (e.g., region 111 is p-type and region 113 is n-type, or region 111 is n-type and region 113 is p-type). In the example in FIG. 1B, each of the discrete regions 114 of the second doped region 113 forms a diode with the first doped region 111 and the optional intrinsic region 112. Namely, in the example in FIG. 1B, the X-ray absorption layer 110 has a plurality of diodes having the first doped region 111 as a shared electrode. The first doped region 111 may also have discrete portions.

When an X-ray photon hits the X-ray absorption layer 110 including diodes, the X-ray photon may be absorbed and generate one or more charge carriers by a number of mechanisms. An X-ray photon may generate 10 to 100000 charge carriers. The charge carriers may drift to the electrodes of one of the diodes under an electric field. The field may be an external electric field. The electrical contact 119B may include discrete portions each of which is in electrical contact with the discrete regions 114. In an embodiment, the charge carriers may drift in directions such that the charge carriers generated by a single X-ray photon are not substantially shared by two different discrete regions 114 ("not substantially shared" here means less than 2%, less than 0.5%, less than 0.1%, or less than 0.01% of these charge carriers flow to a different one of the discrete regions 114 than the rest of the charge carriers). Charge carriers generated by an X-ray photon incident around the footprint of one of these discrete regions 114 are not substantially shared with another of these discrete regions 114. A pixel 150 associated with a discrete region 114 may be an area around the discrete region 114 in which substantially all (more than 98%, more than 99.5%, more than 99.9%, or more than 99.99% of) charge carriers generated by an X-ray photon incident therein flow to the discrete region 114. Namely, less than 2%, less than 1%, less than 0.1%, or less than 0.01% of these charge carriers flow beyond the pixel.

Figure 1C:
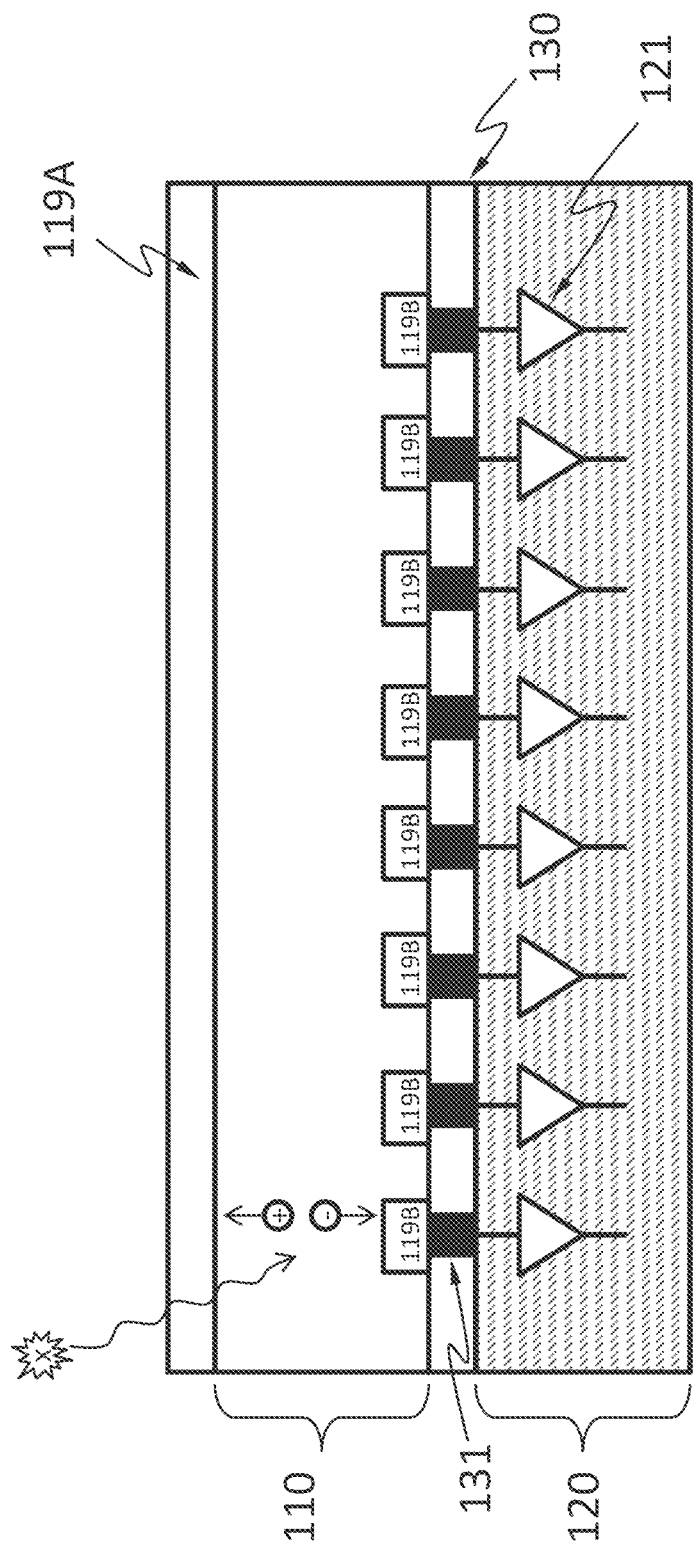
FIG. 1C schematically shows an alternative detailed cross-sectional view of the detector, according to an embodiment.

As shown in an alternative detailed cross-sectional view of the detector 100 in FIG. 1C, according to an embodiment, the X-ray absorption layer 110 may include a resistor of a semiconductor material such as, silicon, germanium, GaAs, CdTe, CdZnTe, or a combination thereof, but does not include a diode. The semiconductor may have a high mass attenuation coefficient for the X-ray energy of interest.

When an X-ray photon hits the X-ray absorption layer 110 including a resistor but not diodes, it may be absorbed and generate one or more charge carriers by a number of mechanisms. An X-ray photon may generate 10 to 100000 charge carriers. The charge carriers may drift to the electrical contacts 119A and 119B under an electric field. The field may be an external electric field. The electrical contact 119B includes discrete portions. In an embodiment, the charge carriers may drift in directions such that the charge carriers generated by a single X-ray photon are not substantially shared by two different discrete portions of the electrical contact 119B ("not substantially shared" here means less than 2%, less than 0.5%, less than 0.1%, or less than 0.01% of these charge carriers flow to a different one of the discrete portions than the rest of the charge carriers). Charge carriers generated by an X-ray photon incident around the footprint of one of these discrete portions of the electrical contact 1193 are not substantially shared with another of these discrete portions of the electrical contact 119B. A pixel 150 associated with a discrete portion of the electrical contact 1193 may be an area around the discrete portion in which substantially all (more than 98%, more than 99.5%, more than 99.9% or more than 99.99% of) charge carriers generated by an X-ray photon incident therein flow to the discrete portion of the electrical contact 119B. Namely, less than 2%, less than 0.5%, less than 0.1%, or less than 0.01% of these charge carriers flow beyond the pixel associated with the one discrete portion of the electrical contact 119B.

The electronics layer 120 may include an electronic system 121 suitable for processing or interpreting signals generated by X-ray photons incident on the X-ray absorption layer 110. The electronic system 121 may include an analog circuitry such as a filter network, amplifiers, integrators, and comparators, or a digital circuitry such as a microprocessors, and memory. The electronic system 121 may include components shared by the pixels or components dedicated to a single pixel. For example, the electronic system 121 may include an amplifier dedicated to each pixel and a microprocessor shared among all the pixels. The electronic system 121 may be electrically connected to the pixels by vias 131. Space among the vias may be filled with a filler material 130, which may increase the mechanical stability of the connection of the electronics layer 120 to the X-ray absorption layer 110. Other bonding techniques are possible to connect the electronic system 121 to the pixels without using vias.

Figure 2:
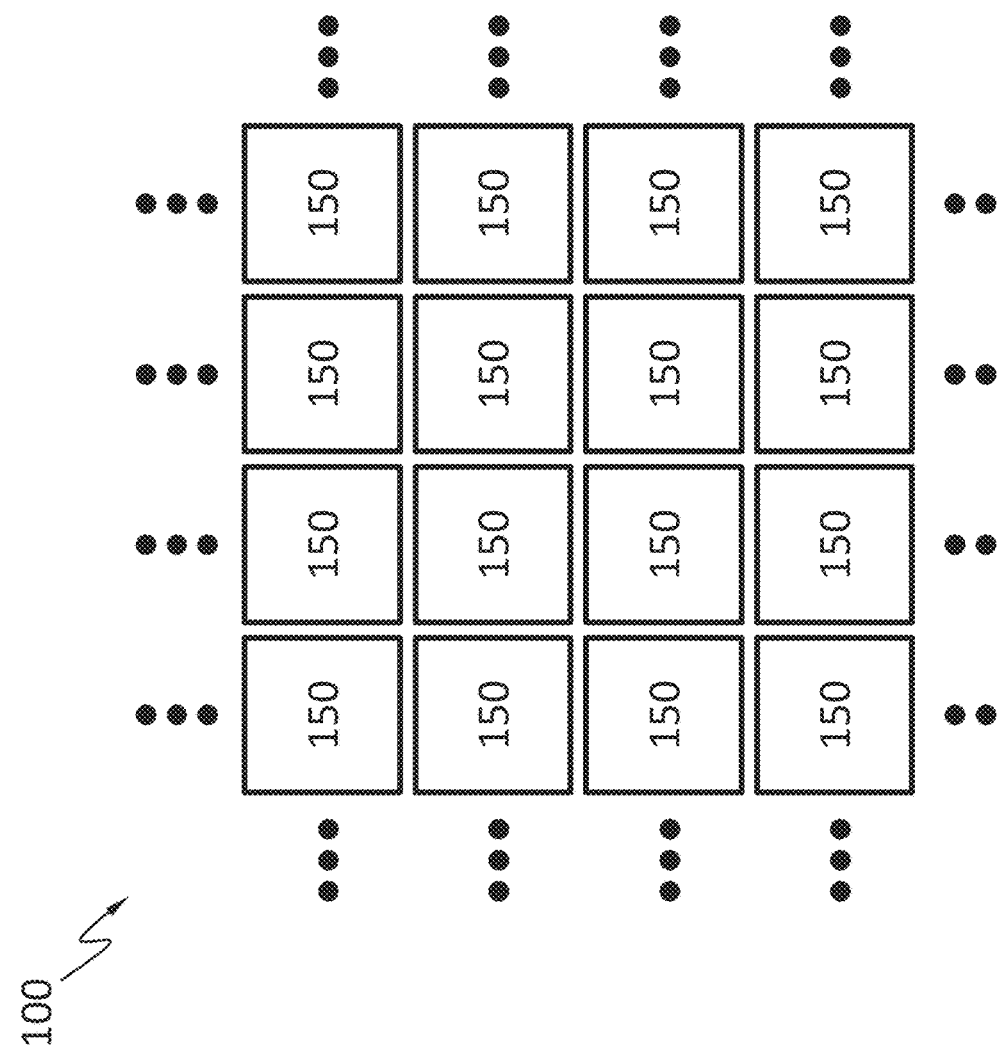
FIG. 2 schematically shows that the device may have an array of pixels, according to an embodiment.

FIG. 2 schematically shows that the detector 100 may have an array of pixels 150. The array may be a rectangular array, a honeycomb array, a hexagonal array or any other suitable array. Each pixel 150 may be configured to detect an X-ray photon incident thereon, measure the energy of the X-ray photon, or both. For example, each pixel 150 may be configured to count numbers of X-ray photons incident thereon whose energy falls in a plurality of bins, within a period of time. All the pixels 150 may be configured to count the numbers of X-ray photons incident thereon within a plurality of bins of energy within the same period of time. Each pixel 150 may have its own analog-to-digital converter (ADC) configured to digitize an analog signal representing the energy of an incident X-ray photon into a digital signal. The ADC may have a resolution of 10 bits or higher. Each pixel 150 may be configured to measure its dark current, such as before or concurrently with each X-ray photon incident thereon. Each pixel 150 may be configured to deduct the contribution of the dark current from the energy of the X-ray photon incident thereon. The pixels 150 may be configured to operate in parallel. For example, when one pixel 150 measures an incident X-ray photon, another pixel 150 may be waiting for an X-ray photon to arrive. The pixels 150 may be but do not have to be individually addressable.

Figure 3:
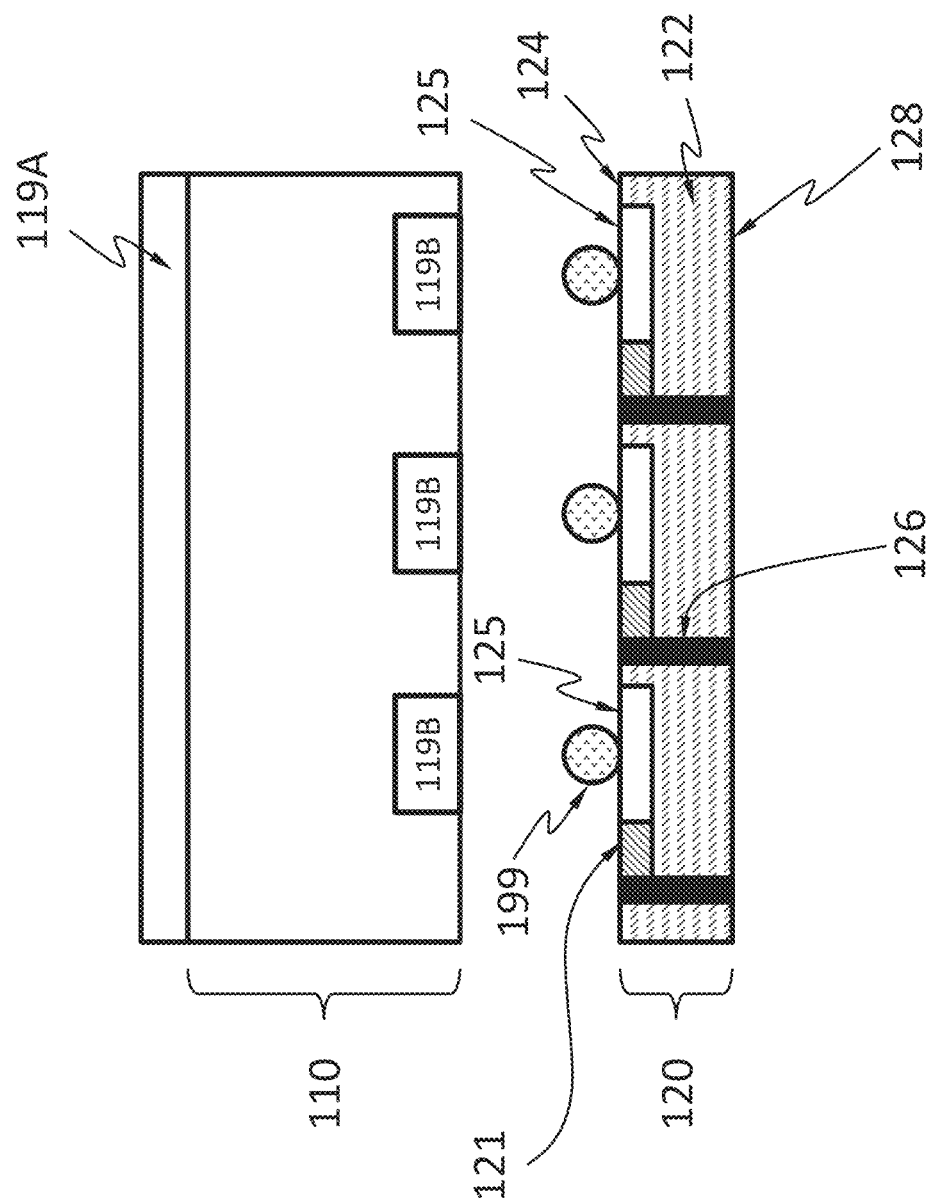
FIG. 3 schematically shows a cross-sectional view of an electronics layer in the detector, according to an embodiment.

FIG. 3 schematically shows the electronics layer 120 according to an embodiment. The electronic layer 120 comprises a substrate 122 having a first surface 124 and a second surface 128. A "surface" as used herein is not necessarily exposed, but can be buried wholly or partially. The electronic layer 120 comprises one or more electric contacts 125 on the first surface 124. The one or more electric contacts 125 may be configured to be electrically connected to one or more electrical contacts 119B of the X-ray absorption layer 110. The electronics system 121 may be in or on the substrate 122. The electronic layer 120 comprises one or more vias 126 extending from the first surface 124 to the second surface 128.

The substrate 122 may be a thinned substrate. For example, the substrate may have at thickness of 750 microns or less, 200 microns or less, 100 microns or less, 50 microns or less, 20 microns or less, or 5 microns or less. The substrate 122 may be a silicon substrate or a substrate or other suitable semiconductor or insulator. The substrate 122 may be produced by grinding a thicker substrate to a desired thickness.

The one or more electric contacts 125 may be a layer of metal or doped semiconductor. For example, the electric contacts 125 may be gold, copper, platinum, palladium, doped silicon, etc.

The vias 126 pass through the substrate 122 and electrically connect electrical components (e.g., the electrical contacts 125 and the electronic system 121) on the first surface 124 to electrical components on the second surface

128. The vias 126 are sometimes referred to as "through-silicon vias" although they may be fabricated in substrates of materials other than silicon. Multiple electronical components on the first surface 124 may share one via 126.

FIG. 3 further schematically shows bonding between the X-ray absorption layer 110 and the electronic layer 120 at the electrical contact 119B and the electrical contacts 125. The bonding may be by a suitable technique such as direct bonding or flip chip bonding.

Direct bonding is a wafer bonding process without any additional intermediate layers (e.g., solder bumps). The bonding process is based on chemical bonds between two surfaces. Direct bonding may be at elevated temperature but not necessarily so.

Flip chip bonding uses solder bumps 199 deposited onto contact pads (e.g., the electrical contact 119B of the X-ray absorption layer 110 or the electrical contacts 125). Either the X-ray absorption layer 110 or the electronic layer 120 is flipped over and the electrical contact 119J of the X-ray absorption layer 110 are aligned to the electrical contacts 125. The solder bumps 199 may be melted to solder the electrical contact 119J and the electrical contacts 125 together. Any void space among the solder bumps 199 may be filled with an insulating material.

Figure 4A:
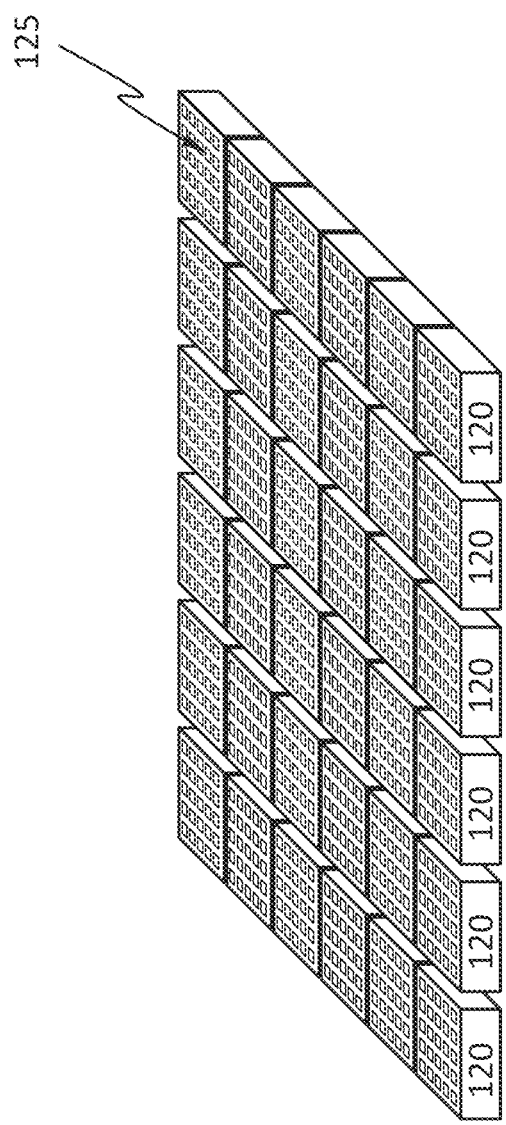
FIG. 4A-FIG. 4C schematically show a process of packaging the detector 100, according to an embodiment.
Figure 4B:
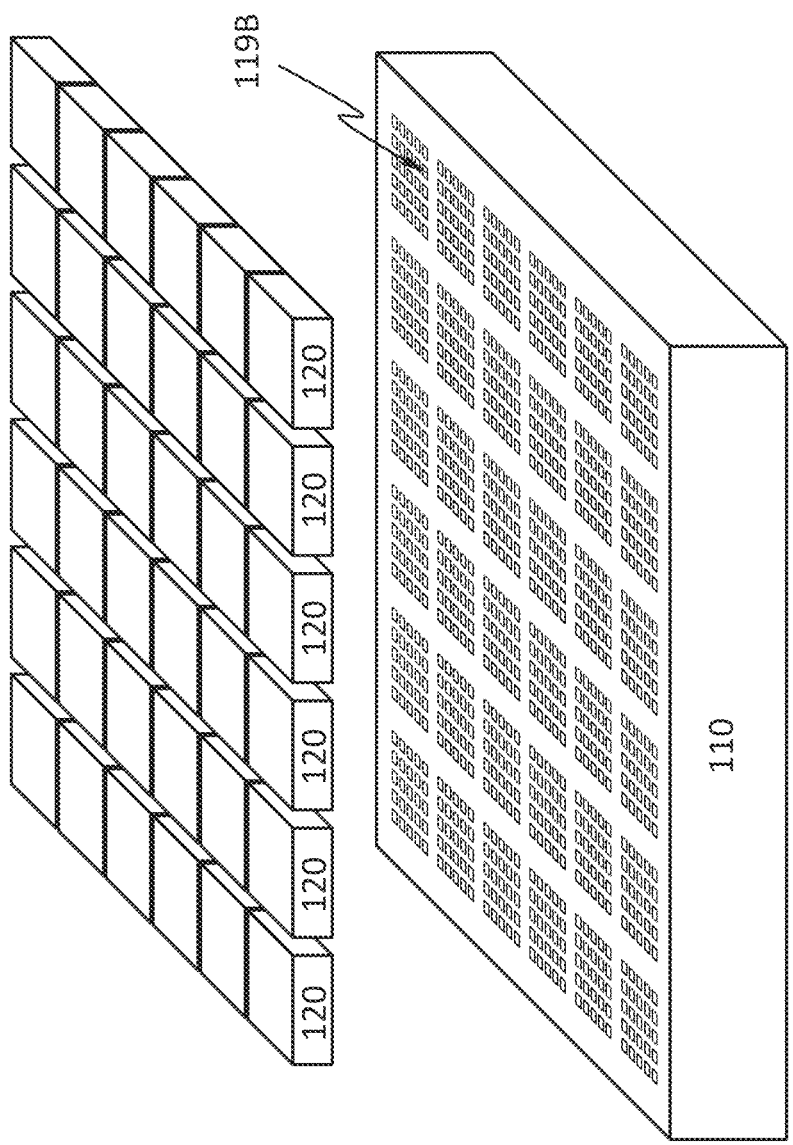
Figure 4C:
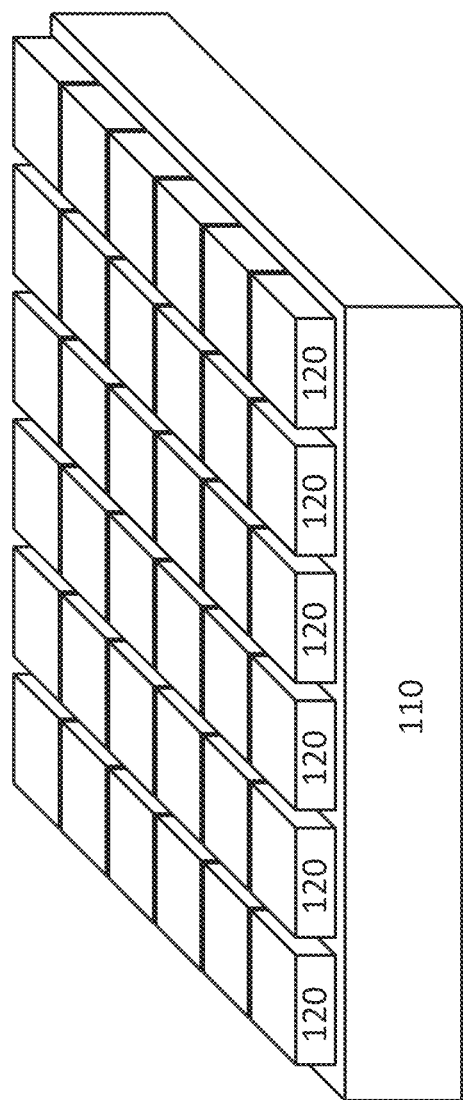

FIG. 4A-FIG. 4C schematically show a process of packaging the detector 100, according to an embodiment.

FIG. 4A schematically shows that multiple chips are obtained. Each of the chips includes the electronic layer 120 and the electrical contacts 125. The chips may be obtained by dicing a wafer with multiple dies.

FIG. 4B schematically shows that the electrical contacts 125 of the chips are aligned to the electrical contacts 119B of the X-ray absorption layer 110. In this view, the electrical contacts 125 are not visible because they face the X-ray absorption layer 110 but the electrical contacts 119B are visible.

FIG. 4C schematically shows that the chips are bonded to the X-ray absorption layer 110 using a suitable bonding method. The electrical contacts 119B of the X-ray absorption layer 110 are now electrically connected to the electrical contacts 125 of the electronic layer 120.

FIG. 5A-FIG. 5F schematically show a process of mounting a plurality of chips onto a substrate, according to an embodiment. This process may be used in mounting the chips depicted in FIG. 4C.

Figure 5A:
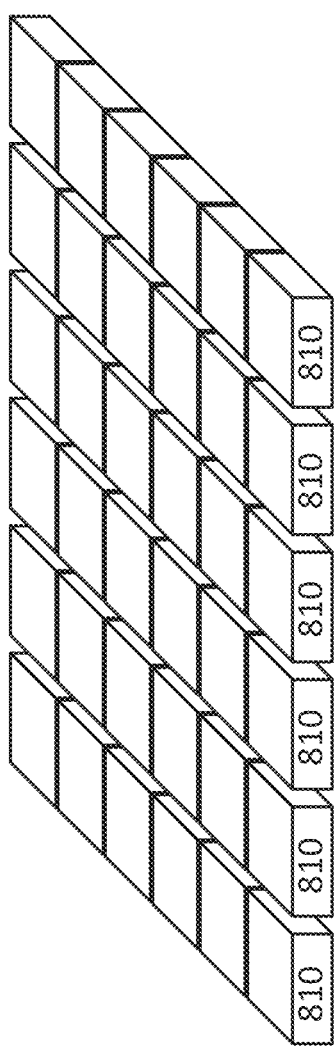

FIG. 5A schematically shows that chips 810 (e.g., the chip including the electronic layer 120 as shown in FIG. 4C) may be obtained and placed into an array or any other suitable arrangement.

Figure 5B:
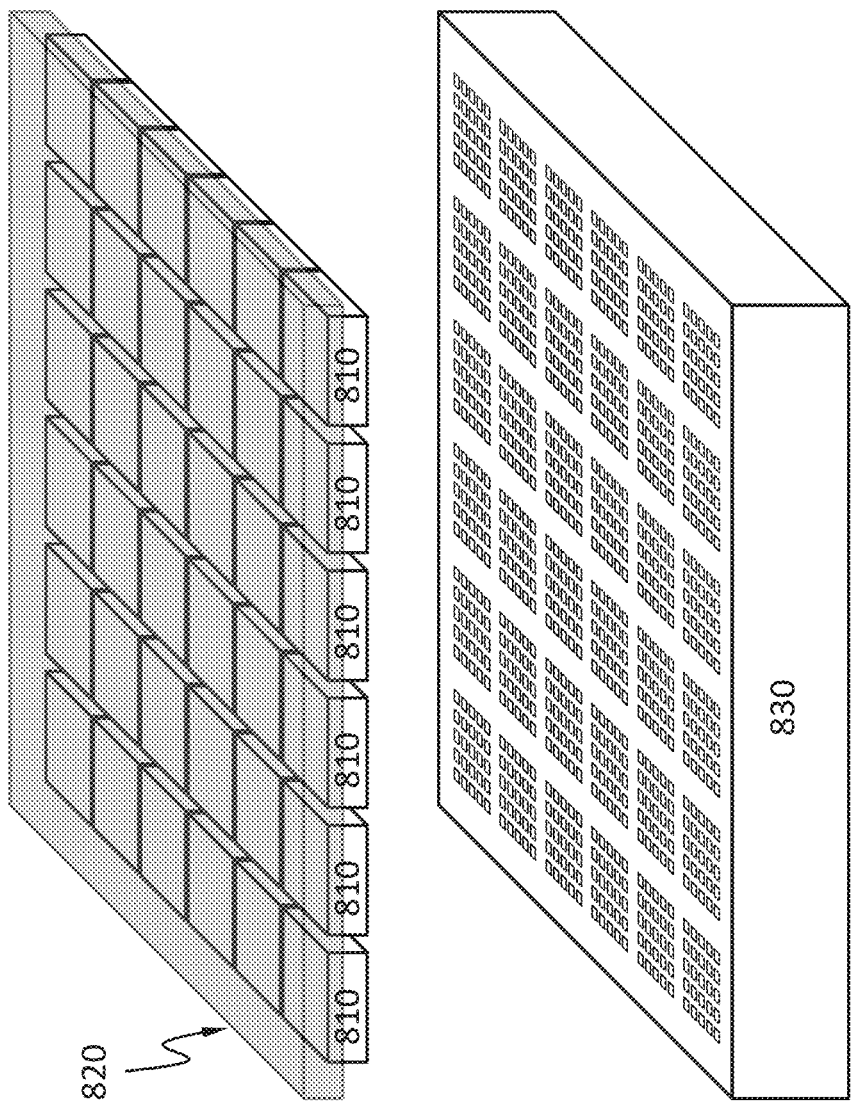

FIG. 5B schematically shows that the chips 810 are attached to a support wafer 820. For example, the chips 810 maybe attached with an adhesive.

Figure 5C:
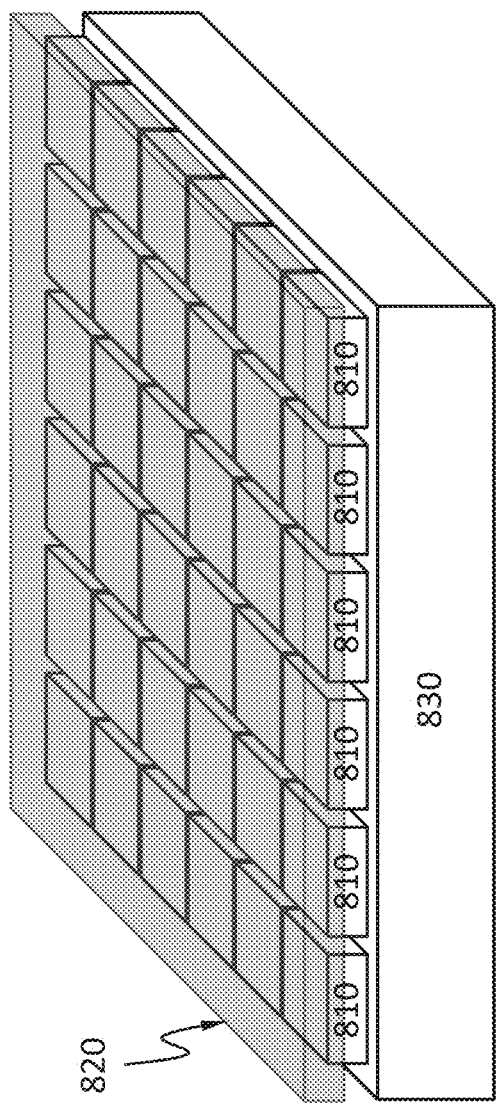

FIG. 5C schematically shows that the chips 810 are mounted to the substrate 830 while still attached to the support wafer 820. The substrate 830 can be the X-ray absorption layer 110 depicted in FIG. 4C.

FIG. 5D schematically shows an alternative, where the chips 810 attached to a single support wafer 820 may be mounted to multiple substrates 830.

FIG. 5E schematically shows an alternative, where the chips 810 are mounted to multiple substrates 830 but the boundaries among the chips 810 and the boundaries among the substrate 830 may not coincide. Namely, the electrical contacts 125 on a given chip 810 may be connected to different substrates 830 and the electrical contacts 119B on a given substrate 830 may be connected to different chips 810. The chips 810 and the substrates 830 may both include transmission lines and contacts configured to connect the transmission lines in them. For clarity, some components of the chips 810 and the substrates 830 are omitted in FIG. 5E.

Figure 5F:
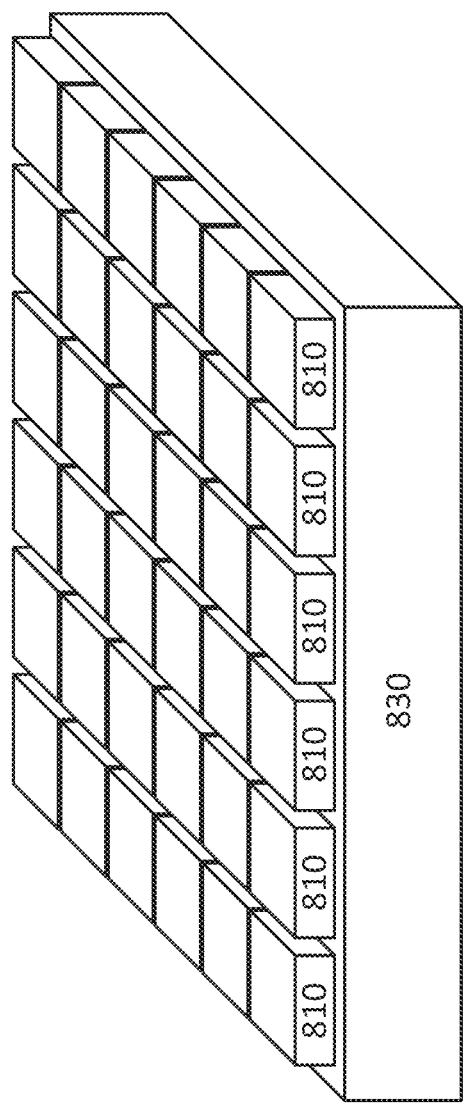

FIG. 5F schematically shows that the support wafer 820 is removed. For example, the support wafer 820 may be ground away, etched away, or separated from the chips 810.

FIG. 6A-FIG. 6E schematically show a process of mounting a plurality of chips onto a substrate, according to an embodiment. This process may be used in mounting the chips depicted in FIG. 4C.

Figure 6A:
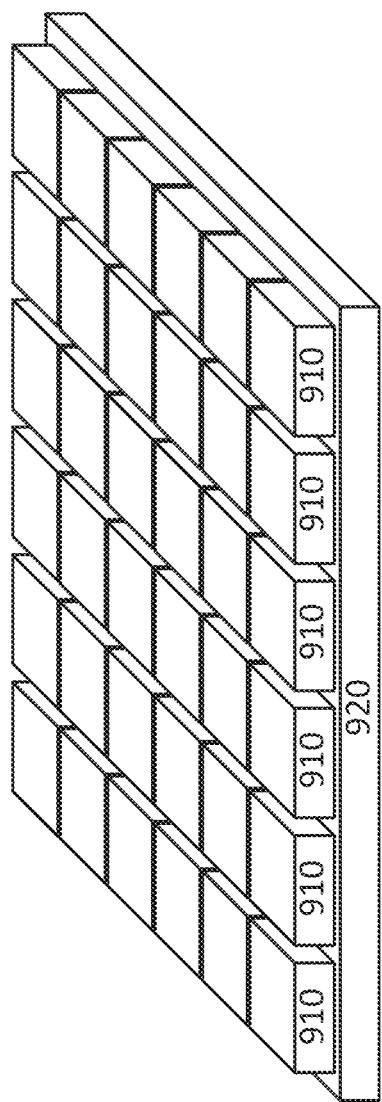

FIG. 6A schematically shows that chips 910 (e.g., the chip including the electronic layer 120 as shown in FIG. 4C) may be obtained and placed into an array or any other suitable arrangement on a support wafer 920.

Figure 6B:
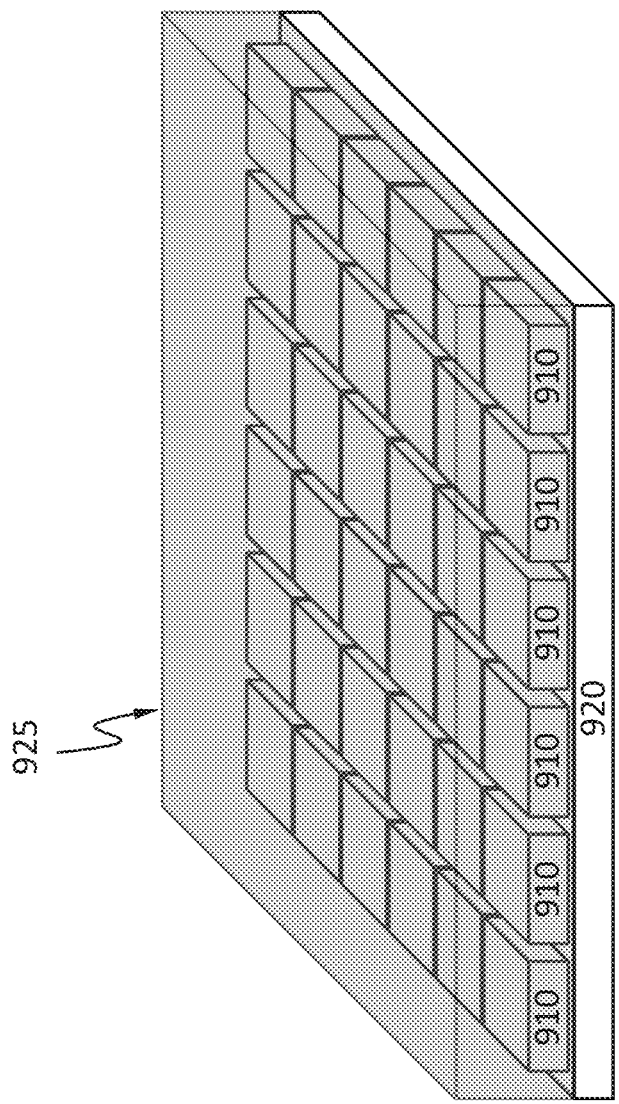

FIG. 6B schematically shows that the chips 910 are encapsulated in a matrix 925. The matrix 925 is supported on the support wafer 920. The matrix 925 may be a polymer, glass or other suitable material. The matrix 925 may fill gaps between the chips 910.

Figure 6C:
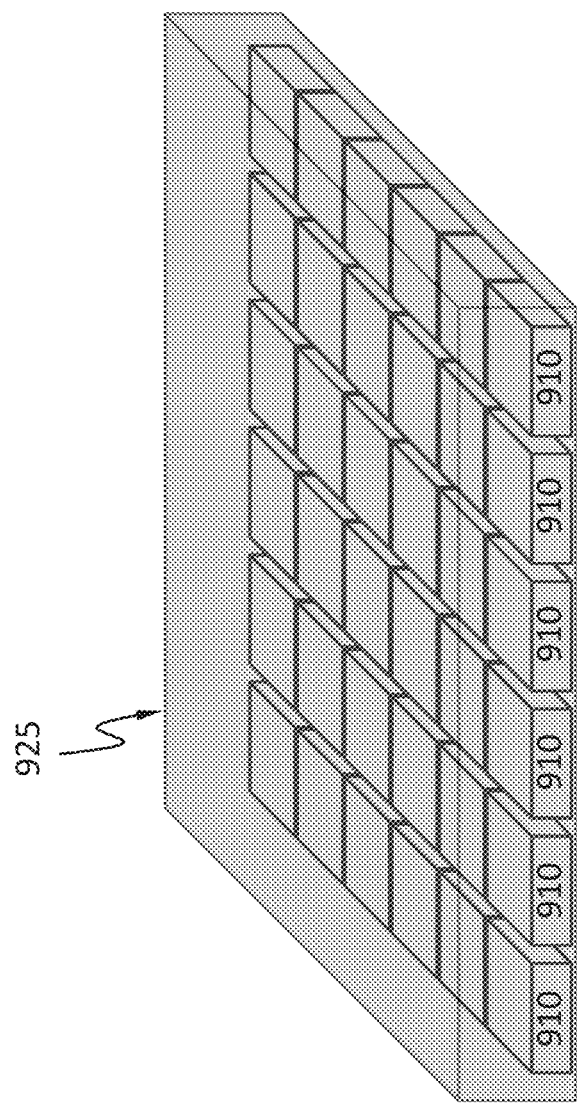

FIG. 6C schematically shows that the support wafer 920 is removed. For example, the support wafer 920 may be ground away, etched away, or separated from the chips 910. The matrix 925 supports the chips 910 after removal of the support wafer 920. The surfaces of the chips 910 contacting the support wafer 920 may be exposed by removal of the support wafer 920.

FIG. 6D schematically shows the encapsulated chips 910 are aligned to the substrate 930. The chips 910 may be then aligned with the substrate 930 (e.g. the X-ray absorption layer 110 depicted in FIG. 4C), or structures thereon (e.g., electrical contacts).

Figure 6E:
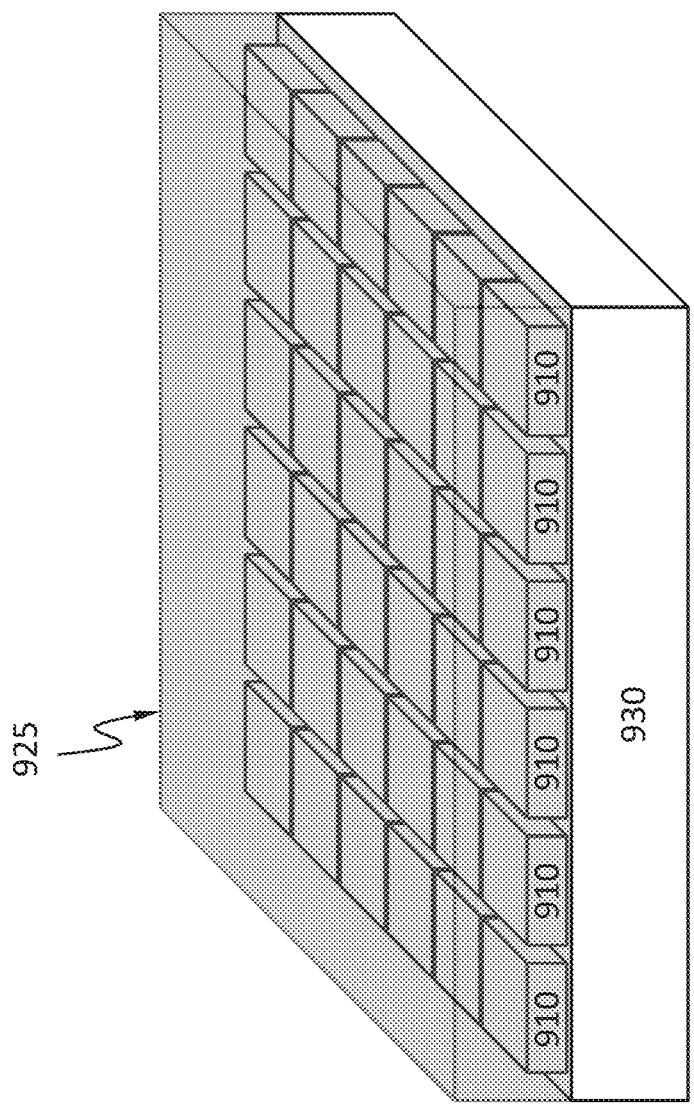

FIG. 6E schematically shows that the encapsulated chips 910 are attached to the substrate 930.

Figure 7A:
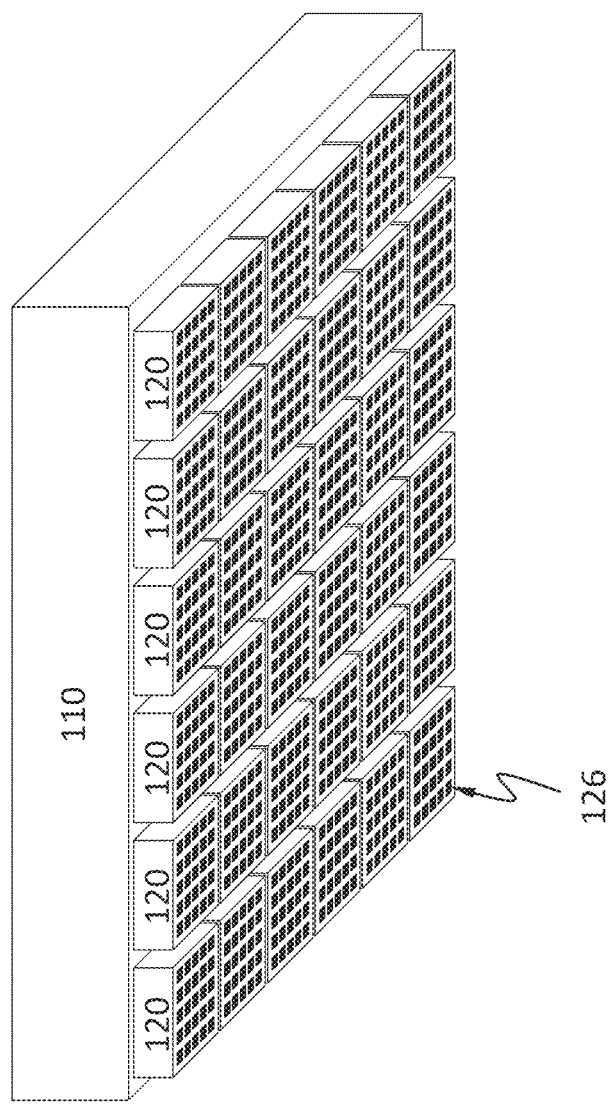
FIG. 7A-FIG. 7C schematically show a process f mounting a plurality of chips onto a substrate, according to an embodiment.

FIG. 7A schematically shows that the chips including the electronic layer 120 may have vias 126 extending to a surface opposite to the X-ray absorption layer 110, to which the chips are mounted.

Figure 7B:
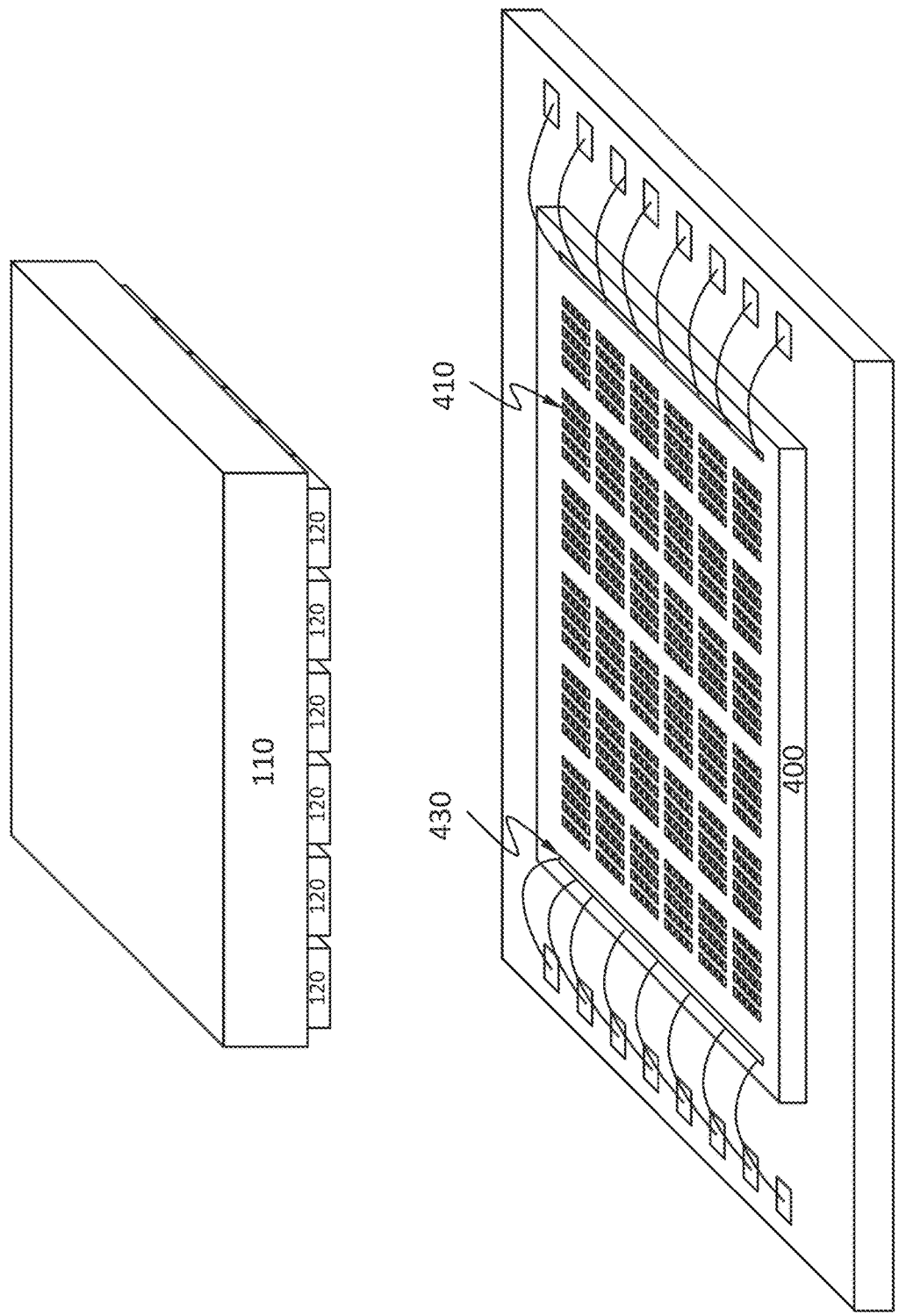

FIG. 7B schematically shows that the vias 126 may be aligned to contacts pads 410 on interposer substrate 400 (e.g., a silicon wafer).

Figure 7C:
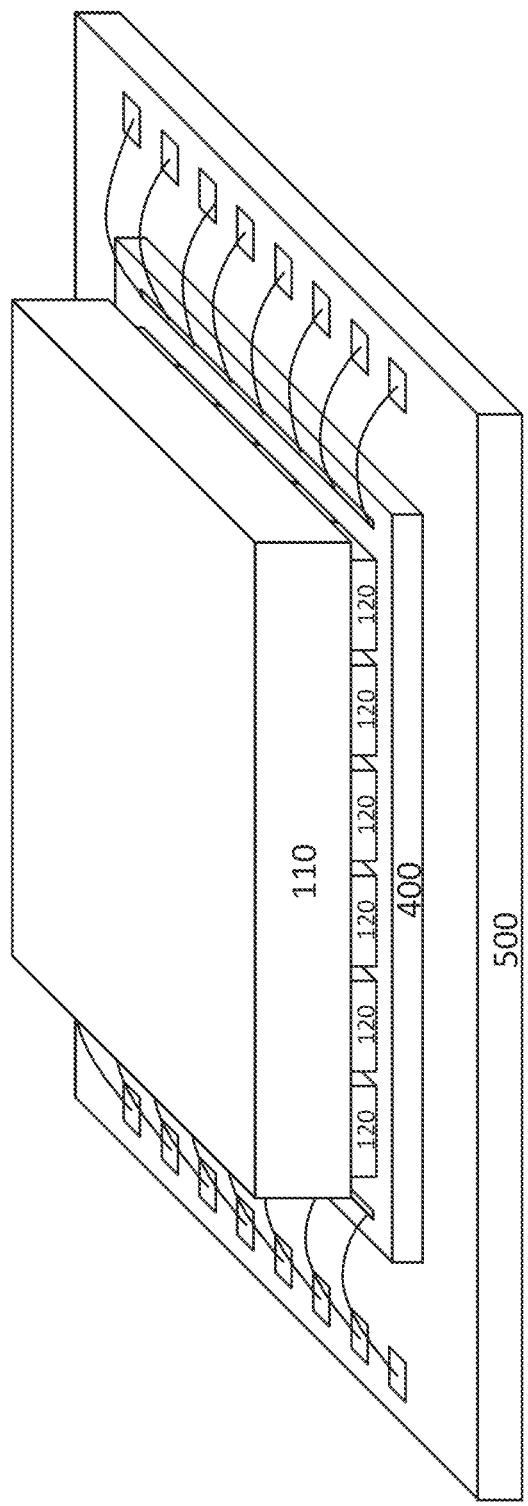

FIG. 7C schematically shows that the electronic layers 120 of the chips are bonded to the interposer substrate 400. After the bonding, the vias 126 are electrically connected contacts pads 410. The interposer substrate 400 may have transmission lines buried in the interposer substrate 400 or on the surface on the interposer substrate 400. The transmission lines are electrically connected to the contact pads 410 and are configured to route signals on the contact pads 410 to bonding pads 430 on the edge of the interposer substrate 400. The interposer substrate 400 is mounted to a printed circuit board 500. Alternatively, the interposer substrate 400 may be positioned side by side with a printed circuit board 500. More than one interposer substrate may be mounted to the same printed circuit board. The electrical contact between the interposer substrate 400 and the printed circuit board 500 may be made with wire bonding.

FIG. 8A schematically shows that the chips including the electronic layer 120 are bonded to the X-ray absorption layer 110.

Figure 8B:
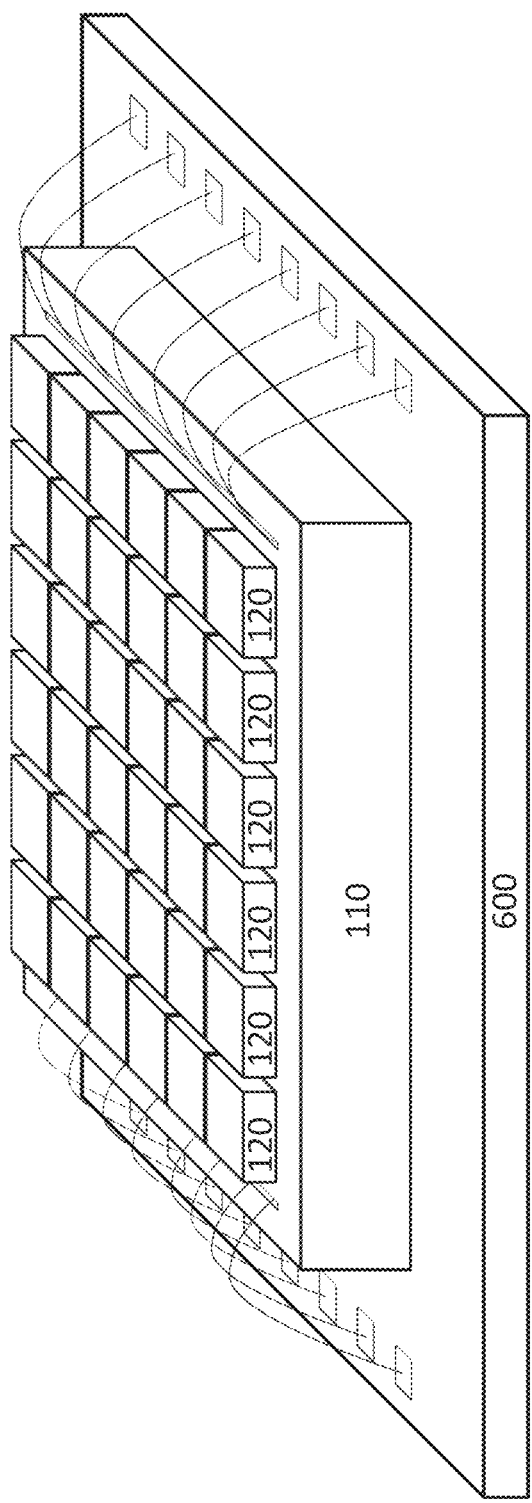

FIG. 8B schematically shows that the X-ray absorption layer 110 is optionally mounted to a printed circuit board 600. Alternatively, the X-ray absorption layer 110 may be optionally positioned side by side with a printed circuit board 600. Electrical contact between the X-ray absorption layer 110 and the printed circuit board 600 may be made with wire bonding.

Figure 8C:
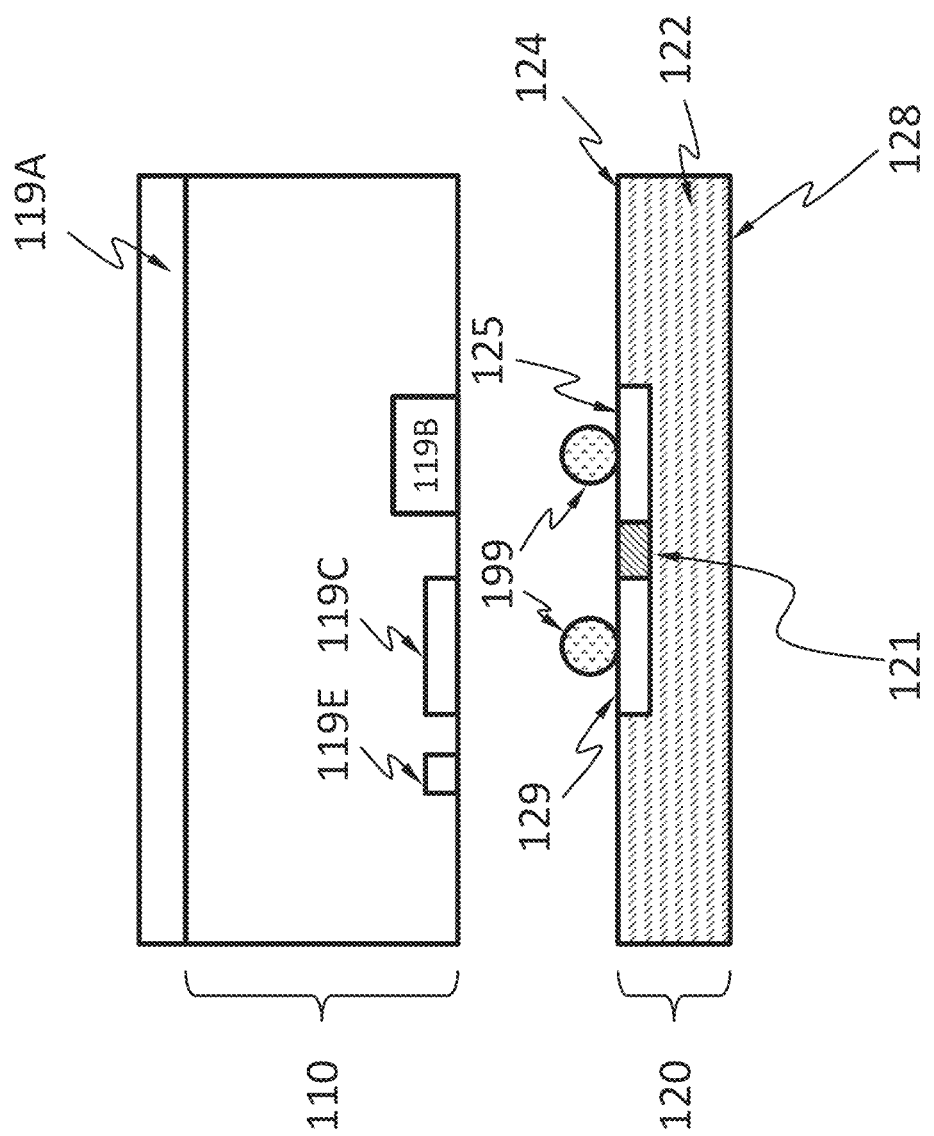

FIG. 8C schematically shows that the first surface 124 of the electronic layer 120 has a set of electrical contacts 129 in addition to the electrical contacts 125. The electrical contacts 129 may function as I/O interface to the electronic system 121. For example the electrical contacts 129 may be configured to read output from the electronic system 121, controlling the electronic system 121, or provide power or reference voltages to the electronic system 121.

Figure 8D:
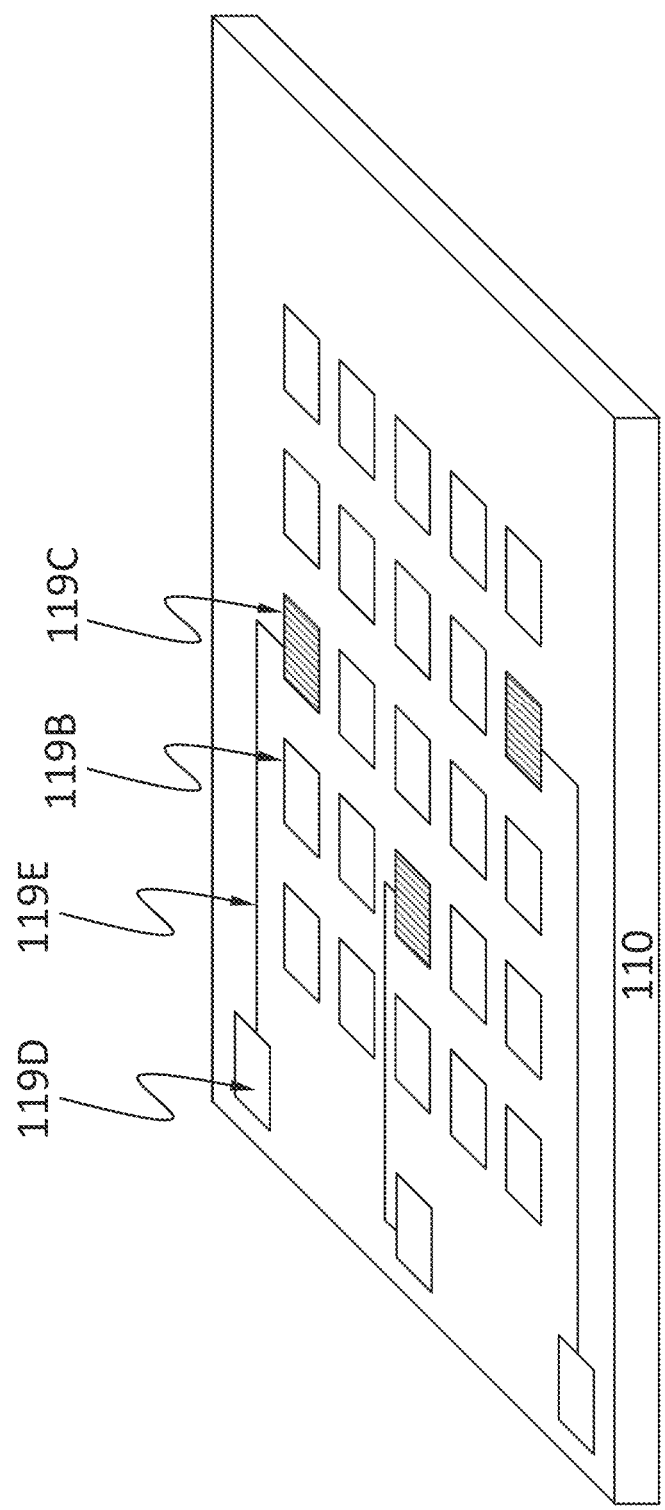
Figure 8E:
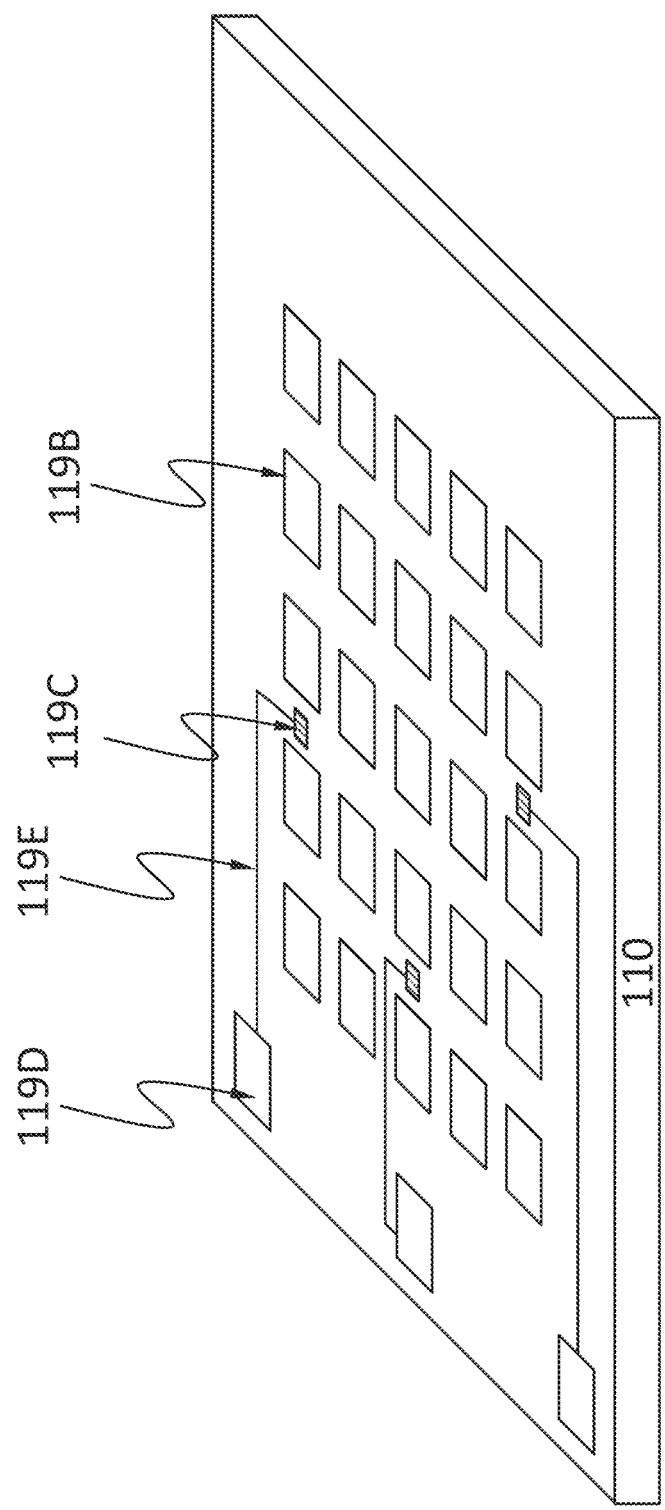

As schematically shown in FIG. 8D and FIG. 8E, the X-ray absorption layer 110 may have electrical contacts 119C configured to connect with the electrical contacts 129 after the chips are mounted to the X-ray absorption layer 110. The X-ray absorption layer 110 may have transmission lines 119E configured to route signals at the electrical contacts 119C to bonding pads 119D near the edge of the X-ray absorption layer 110. The bonding pads 119D may be used to make electrical connections to a PCB or to another integrated circuit. The electrical contacts 119C may be at locations where some of the electrical contact 11913 would otherwise be, as shown in FIG. 8D. The electrical contacts 119C may be located in area between the electrical contact 119B, as shown in FIG. 8E.

FIGS. 8F-8I schematically show routing of signal in the X-ray absorption layer 110 and the electronic layer 120. The features of the X-ray absorption layer 110 such as the electrical contacts 119A and 119B and the discrete regions 114 are usually on the scale of micrometers. The features of the X-ray absorption layer 110 may be fabricated by doing whole-wafer lithography. The features of the electronic layer 120 are usually much smaller and may not be fabricated by doing whole-wafer lithography. Instead, the features of the electronic layer 120 may be fabricated by doing die-by-die lithography. Therefore, making long-distance transmission lines (e.g., across a whole 8" wafer) on the X-ray absorption layer 110 is much easier than making transmission lines across boundaries between the dies.

Figure 8F:
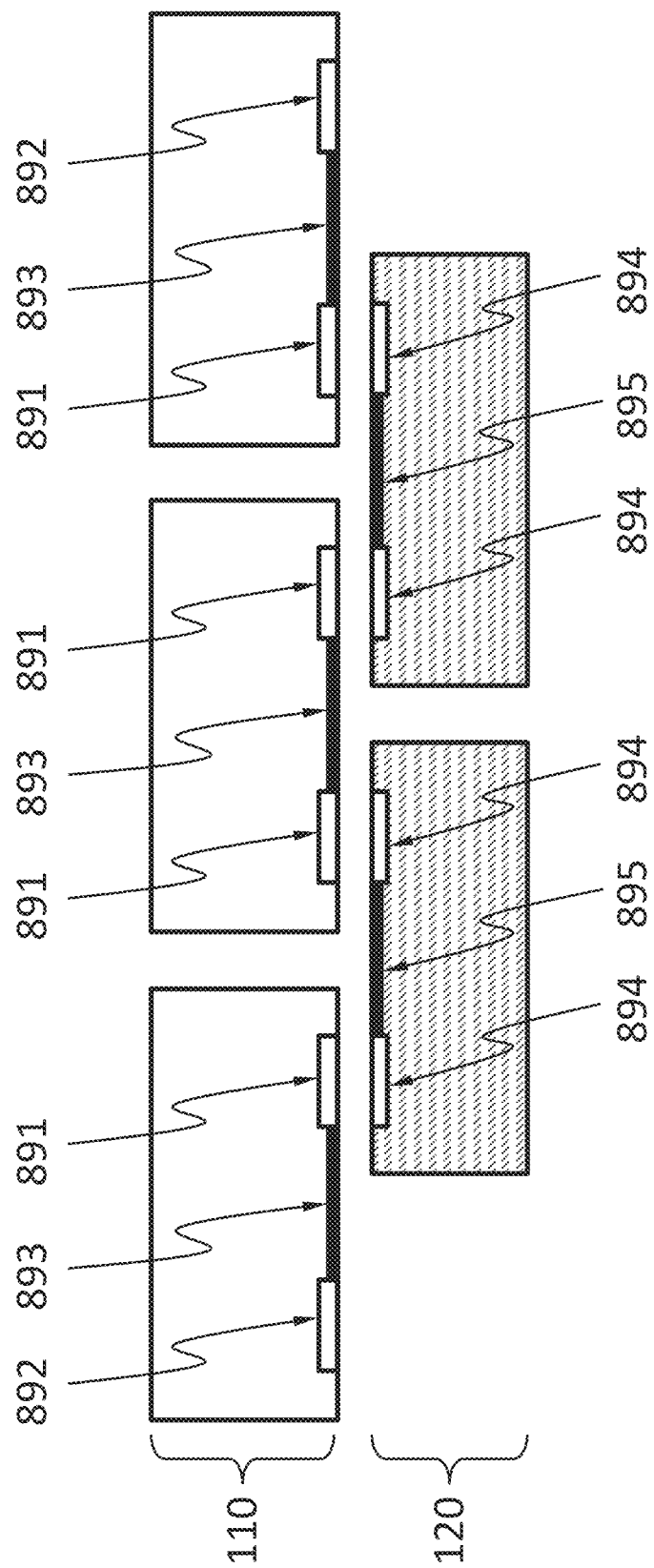
FIGS. 8F-8I schematically show routing of signal in the X-ray absorption layer and the electronic layer.

As shown in FIG. 8F, where multiples chips containing the X-ray absorption layer 110 and multiple chips containing the electronic layer 120 are attached, the chips containing the X-ray absorption layer 110 may include electrical contacts 891, bonding pads 892, transmission lines 893 connecting the electrical contacts 891 to the bonding pads 892; the chips containing the electronic layer 120 may include electrical contacts 894 and transmission lines 895 connecting among the electrical contacts 894. The transmissions lines 895 do not cross boundaries of dies. The electrical contacts 891 and the electrical contacts 894 may be aligned and connected such that signals are bridged across gaps between the chips containing the electronic layer 120 through the transmission lines 893 and across gaps between the chips containing the X-ray absorption layer 110 through the transmission lines 895.

Figure 8G:
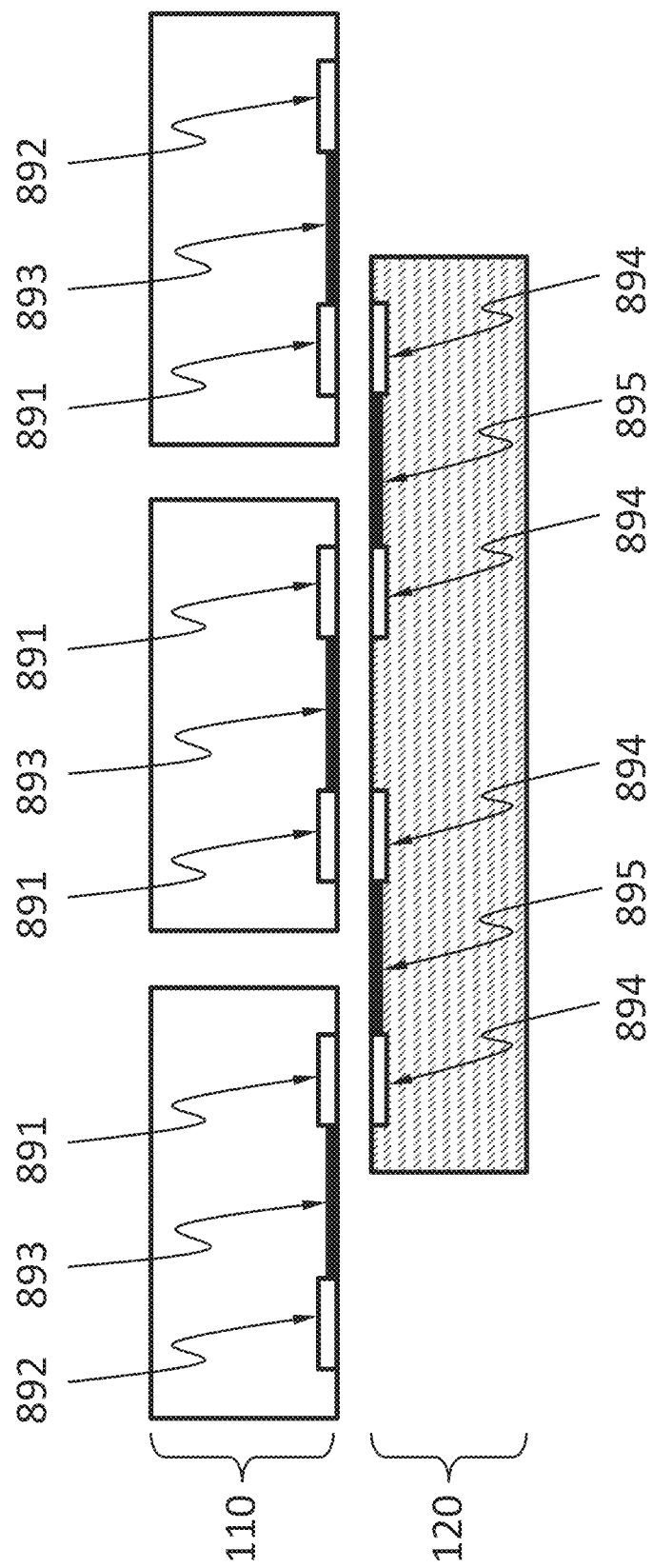

As shown in FIG. 8G, where multiples chips containing the X-ray absorption layer 110 and a wafer containing the electronic layer 120 are attached, the chips containing the X-ray absorption layer 110 may include electrical contacts 891, bonding pads 892, transmission lines 893 connecting the electrical contacts 891 to the bonding pads 892; the wafer containing the electronic layer 120 may include electrical contacts 894 and transmission lines 895 connecting among the electrical contacts 894. The transmissions lines 895 do not cross boundaries of dies. The electrical contacts 891 and the electrical contacts 894 may be aligned and connected such that signals are bridged across gaps between the chips containing the X-ray absorption layer 110 through the transmission lines 895.

Figure 8H:
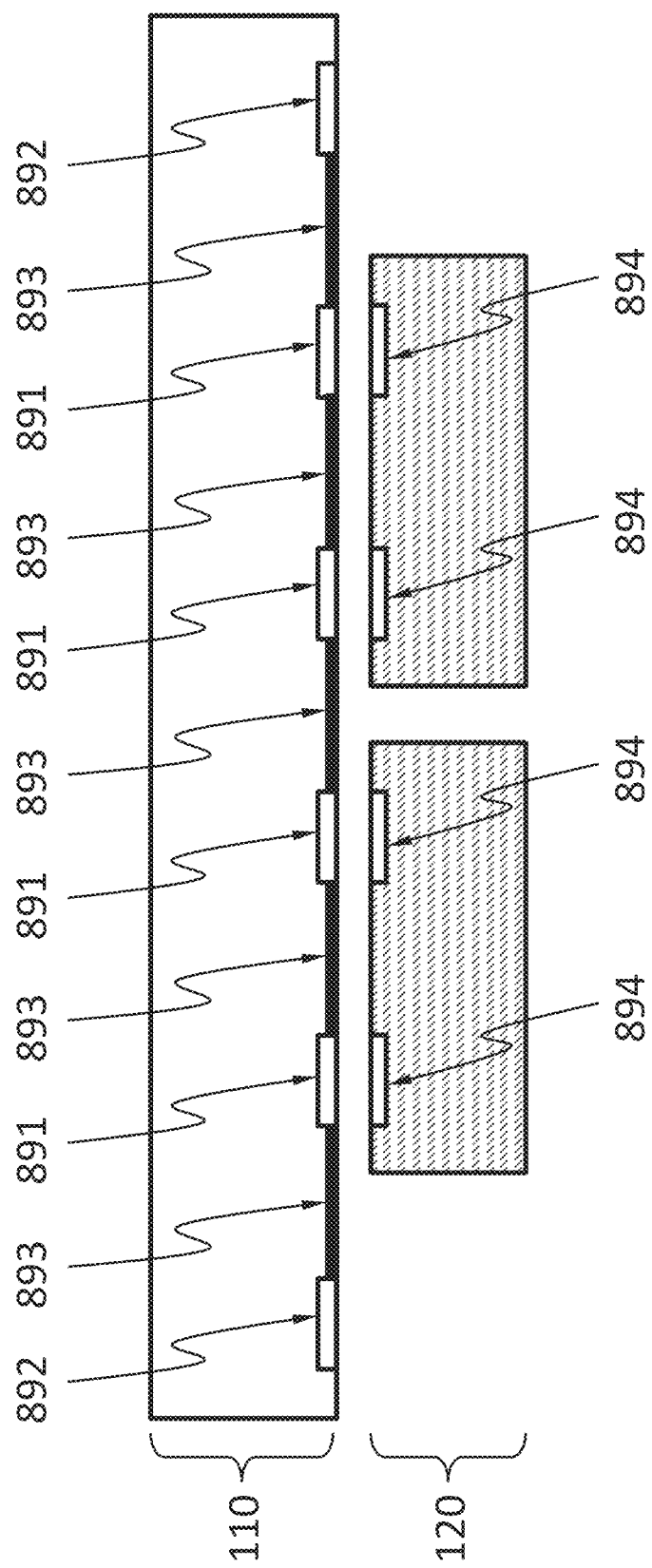

As shown in FIG. 8H, where a wafer containing the X-ray absorption layer 110 and multiple chips containing the electronic layer 120 are attached, the wafer containing the X-ray absorption layer 110 may include electrical contacts 891, bonding pads 892, transmission lines 893 connecting the electrical contacts 891 to the bonding pads 892; the chips containing the electronic layer 120 may include electrical contacts 894 but do not have to include transmission lines connecting among the electrical contacts 894. The electrical contacts 891 and the electrical contacts 894 may be aligned and connected such that signals are bridged across gaps between the chips containing the electronic layer 120 through the transmission lines 893.

Figure 8I:
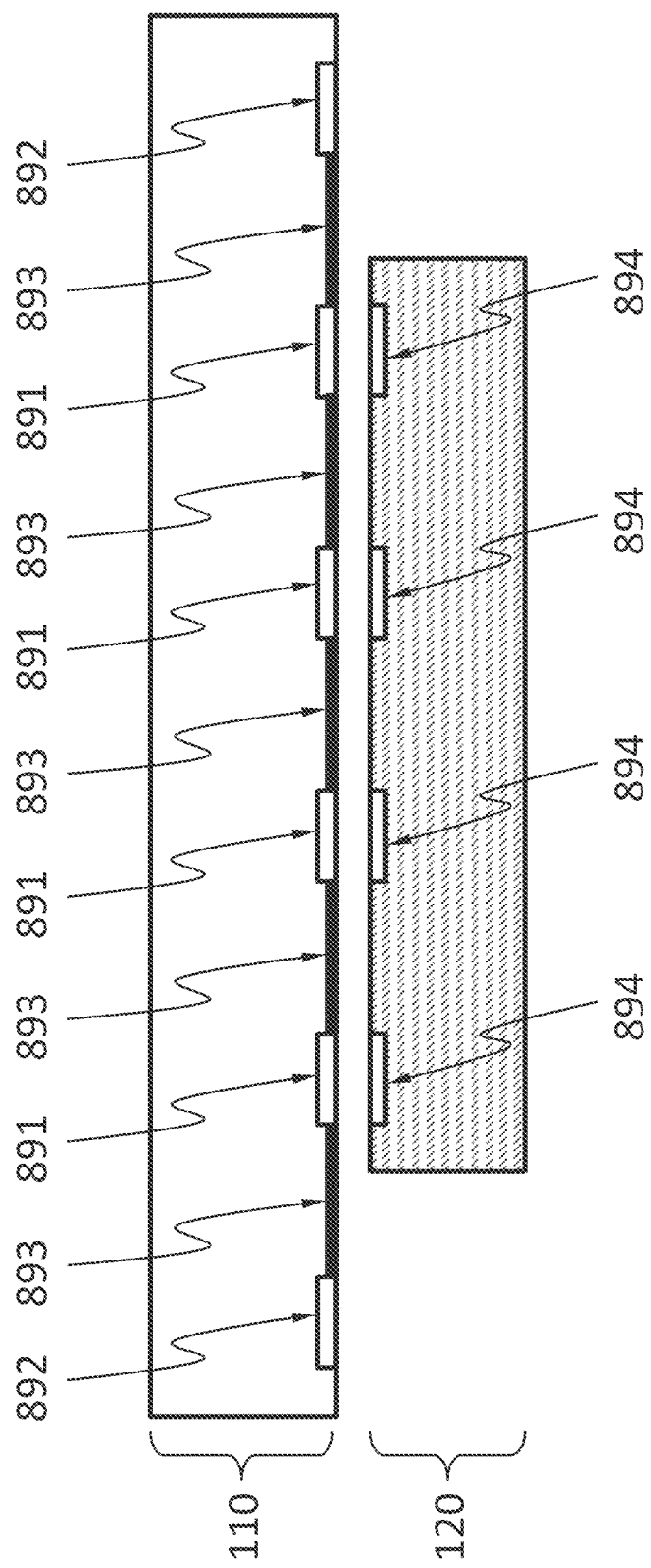

As shown in FIG. 8I, where a wafer containing the X-ray absorption layer 110 and a wafer containing the electronic layer 120 are attached, the wafer containing the X-ray absorption layer 110 may include electrical contacts 891, bonding pads 892, transmission lines 893 connecting the electrical contacts 891 to the bonding pads 892; the wafer containing the electronic layer 120 may include electrical contacts 894 but do not have to include transmission lines connecting among the electrical contacts 894. The electrical contacts 891 and the electrical contacts 894 may be aligned and connected such that signals from the electronic layer 120 are routed through the transmission lines 893.

FIG. 9 schematically shows a system comprising the semiconductor X-ray detector 100 described herein. The system may be used for medical imaging such as chest X-ray radiography, abdominal X-ray radiography, etc. The system comprises an X-ray source 1201. X-ray emitted from the X-ray source 1201 penetrates an object 1202 (e.g., a human body part such as chest, limb, abdomen), is attenuated by different degrees by the internal structures of the object 1202 (e.g., bones, muscle, fat and organs, etc.), and is projected to the semiconductor X-ray detector 100. The semiconductor X-ray detector 100 forms an image by detecting the intensity distribution of the X-ray.

Figure 10:
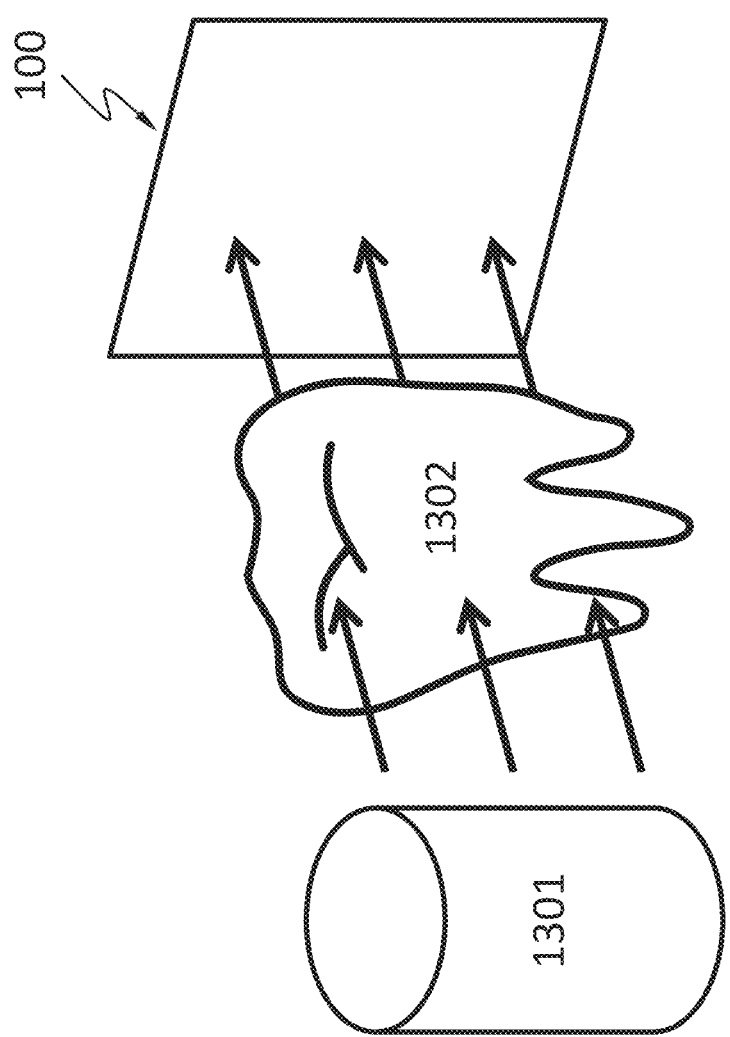

FIG. 10 schematically shows a system comprising the semiconductor X-ray detector 100 described herein. The system may be used for medical imaging such as dental X-ray radiography. The system comprises an X-ray source 1301. X-ray emitted from the X-ray source 1301 penetrates an object 1302 that is part of a mammal (e.g., human) mouth. The object 1302 may include a maxilla bone, a palate bone, a tooth, the mandible, or the tongue. The X-ray is attenuated by different degrees by the different structures of the object 1302 and is projected to the semiconductor X-ray detector 100. The semiconductor X-ray detector 100 forms an image by detecting the intensity distribution of the X-ray. Teeth absorb X-ray more than dental caries, infections, periodontal ligament. The dosage of X-ray radiation received by a dental patient is typically small (around 0.150 mSv for a full mouth series).

Figure 11:
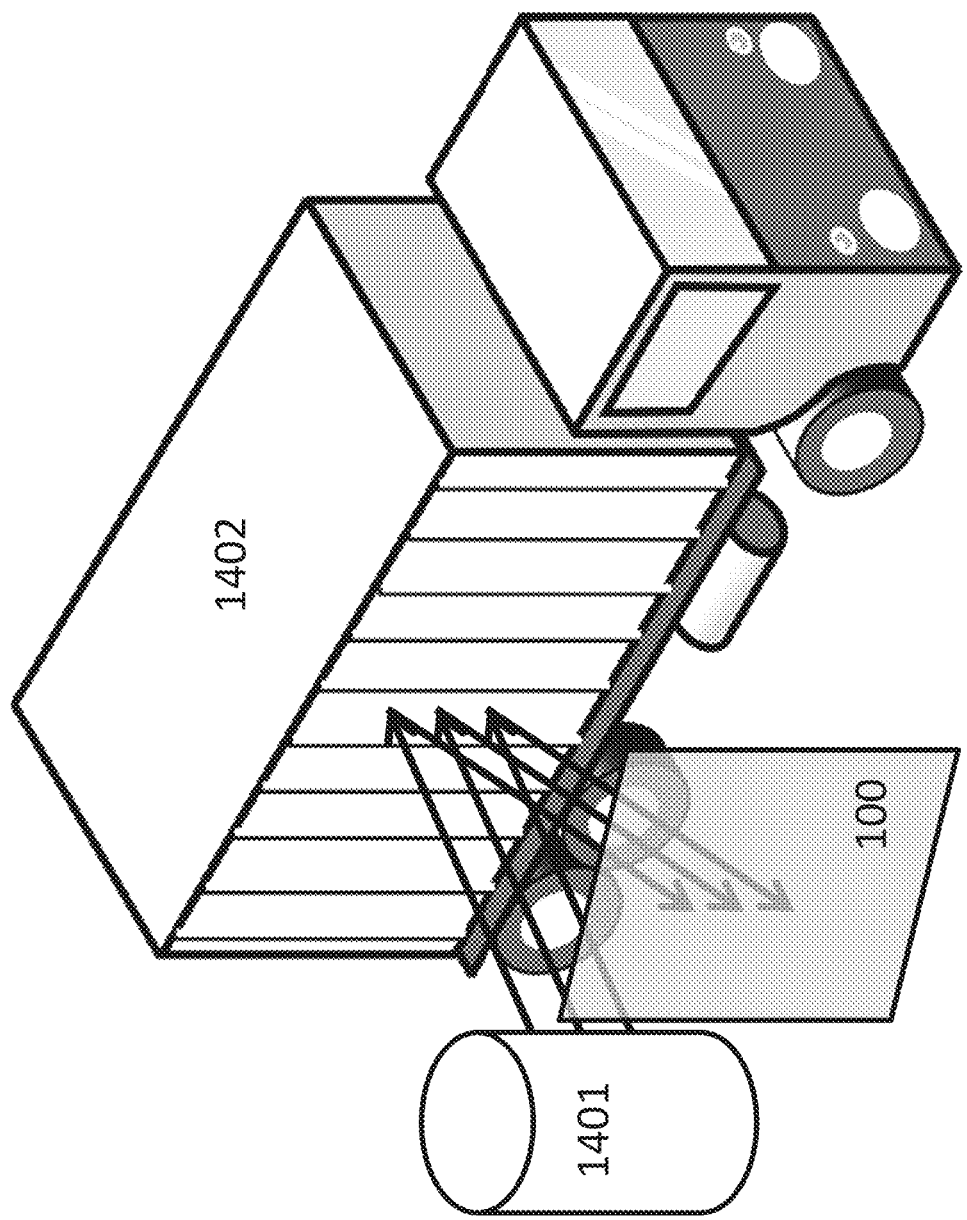
FIG. 11 schematically shows a cargo scanning or non-intrusive inspection (NII) system comprising the semiconductor X-ray detector described herein, according to an embodiment.

FIG. 11 schematically shows a cargo scanning or non-intrusive inspection (NII) system comprising the semiconductor X-ray detector 100 described herein. The system may be used for inspecting and identifying goods in transportation systems such as shipping containers, vehicles, ships, luggage, etc. The system comprises an X-ray source 1401. X-ray emitted from the X-ray source 1401 may backscatter from an object 1402 (e.g., shipping containers, vehicles, ships, etc.) and be projected to the semiconductor X-ray detector 100. Different internal structures of the object 1402 may backscatter X-ray differently. The semiconductor X-ray detector 100 forms an image by detecting the intensity distribution of the backscattered X-ray and/or energies of the backscattered X-ray photons.

Figure 12:
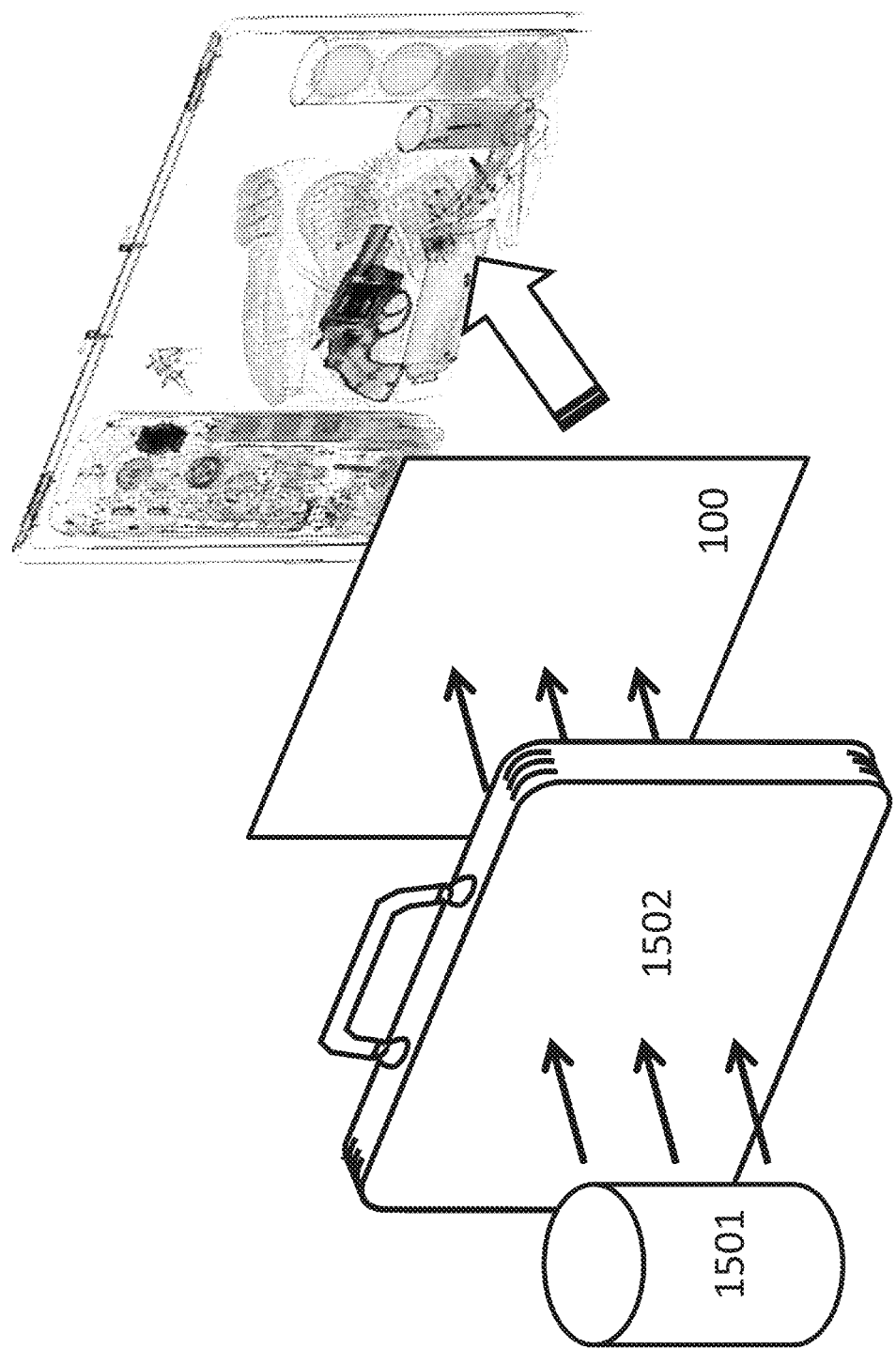
FIG. 12 schematically shows another cargo scanning or non-intrusive inspection (NII) system comprising the semiconductor X-ray detector described herein, according to an embodiment.

FIG. 12 schematically shows another cargo scanning or non-intrusive inspection (NII) system comprising the semiconductor X-ray detector 100 described herein. The system may be used for luggage screening at public transportation stations and airports. The system comprises an X-ray source 1501. X-ray emitted from the X-ray source 1501 may penetrate a piece of luggage 1502, be differently attenuated by the contents of the luggage, and projected to the semiconductor X-ray detector 100. The semiconductor X-ray detector 100 forms an image by detecting the intensity distribution of the transmitted X-ray. The system may reveal contents of luggage and identify items forbidden on public transportation, such as firearms, narcotics, edged weapons, flammables.

Figure 13:
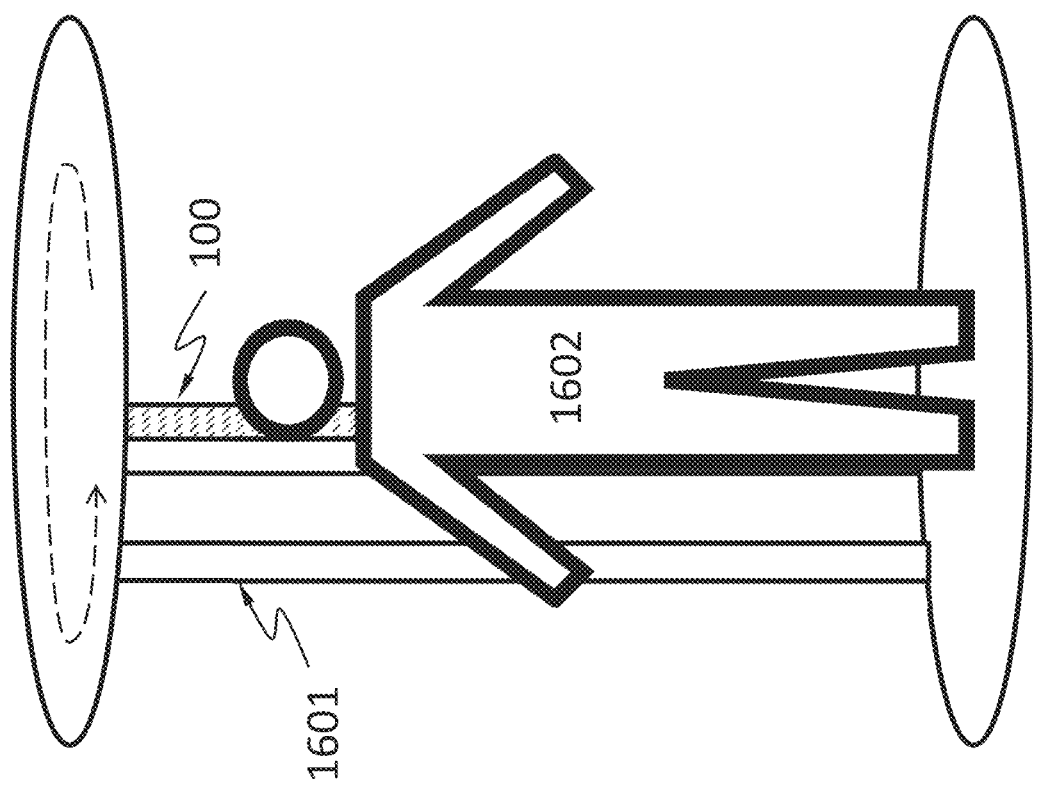
FIG. 13 schematically shows a full-body scanner system comprising the semiconductor X-ray detector described herein, according to an embodiment.

FIG. 13 schematically shows a full-body scanner system comprising the semiconductor X-ray detector 100 described herein. The full-body scanner system may detect objects on a person's body for security screening purposes, without physically removing clothes or making physical contact. The full-body scanner system may be able to detect non-metal objects. The full-body scanner system comprises an X-ray source 1601. X-ray emitted from the X-ray source 1601 may backscatter from a human 1602 being screened and objects thereon, and be projected to the semiconductor X-ray detector 100. The objects and the human body may backscatter X-ray differently. The semiconductor X-ray detector 100 forms an image by detecting the intensity distribution of the backscattered X-ray. The semiconductor X-ray detector 100 and the X-ray source 1601 may be configured to scan the human in a linear or rotational direction.

Figure 14:
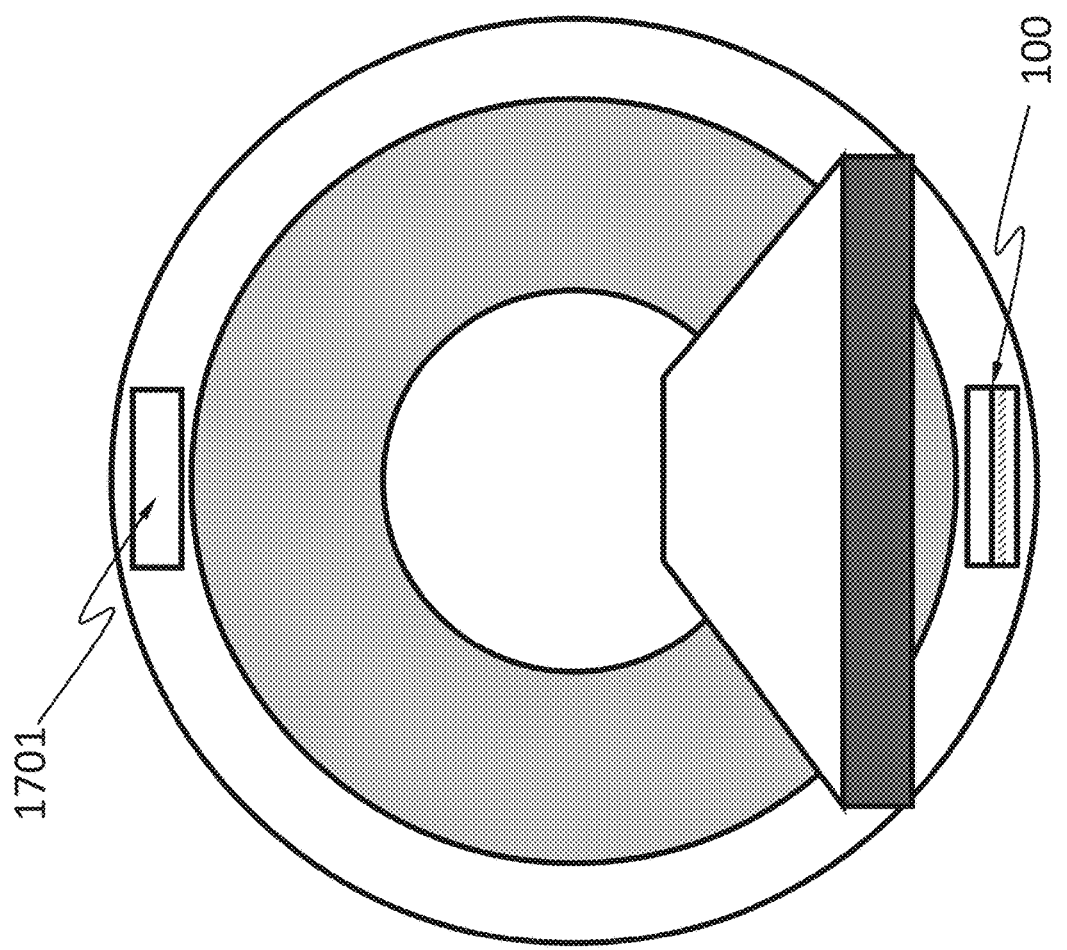
FIG. 14 schematically shows an X-ray computed tomography (X-ray CT) system comprising the semiconductor X-ray detector described herein, according to an embodiment.

FIG. 14 schematically shows an X-ray computed tomography (X-ray CT) system. The X-ray CT system uses computer-processed X-rays to produce tomographic images (virtual "slices") of specific areas of a scanned object. The tomographic images may be used for diagnostic and therapeutic purposes in various medical disciplines, or for flaw detection, failure analysis, metrology, assembly analysis and reverse engineering. The X-ray CT system comprises the semiconductor X-ray detector 100 described herein and an X-ray source 1701. The semiconductor X-ray detector 100 and the X-ray source 1701 may be configured to rotate synchronously along one or more circular or spiral paths.

Figure 15:
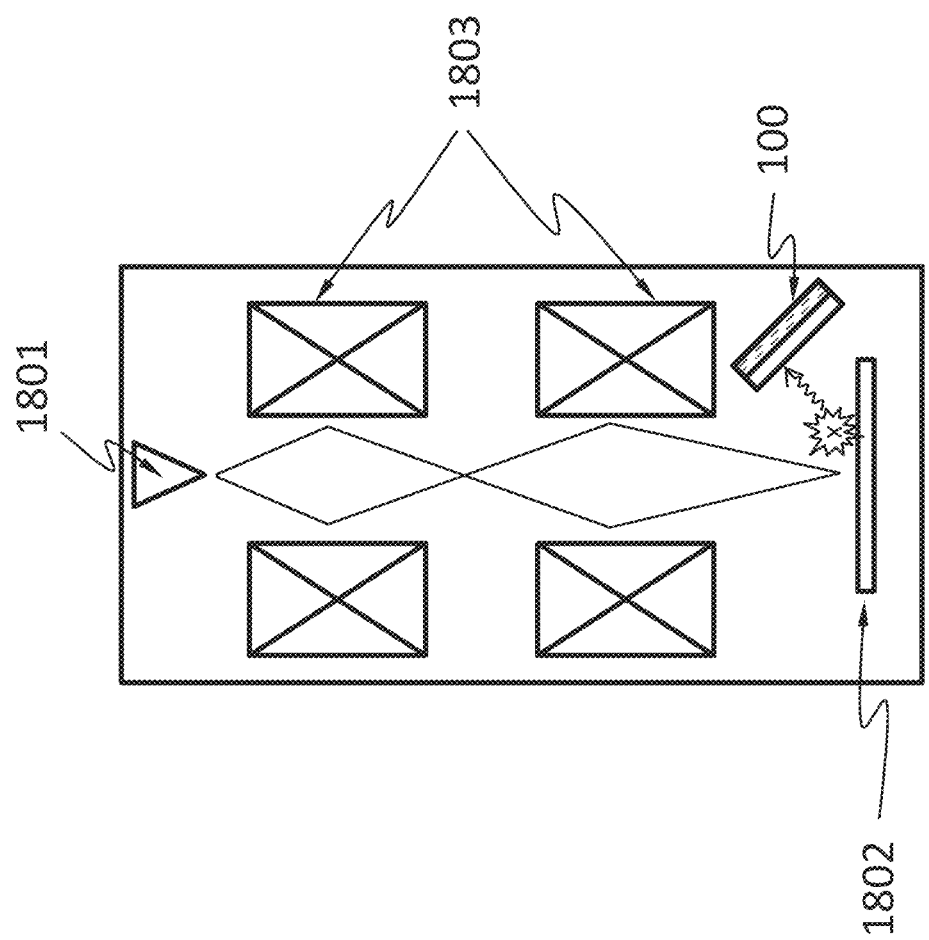
FIG. 15 schematically shows an electron microscope comprising the semiconductor X-ray detector described herein, according to an embodiment.

FIG. 15 schematically shows an electron microscope. The electron microscope comprises an electron source 1801 (also called an electron gun) that is configured to emit electrons. The electron source 1801 may have various emission mechanisms such as thermionic, photocathode, cold emission, or plasmas source. The emitted electrons pass through an electronic optical system 1803, which gray be configured to shape, accelerate, or focus the electrons. The electrons then reach a sample 1802 and an image detector may form an image therefrom. The electron microscope may comprise the semiconductor X-ray detector 100 described herein, for performing energy-dispersive X-ray spectroscopy (EDS). EDS is an analytical technique used for the elemental analysis or chemical characterization of a sample. When the electrons incident on a sample, they cause emission of characteristic X-rays from the sample. The incident electrons may excite an electron in an inner shell of an atom in the sample, ejecting it from the shell while creating an electron hole where the electron was. An electron from an outer, higher-energy shell then fills the hole, and the difference in energy between the higher-energy shell and the lower energy shell may be released in the form of an X-ray. The number and energy of the X-rays emitted from the sample can be measured by the semiconductor X-ray detector 100.

The semiconductor X-ray detector 100 described here may have other applications such as in an X-ray telescope, X-ray mammography, industrial X-ray defect detection, X-ray microscopy or microradiography, X-ray casting inspection, X-ray non-destructive testing, X-ray weld inspection, X-ray digital subtraction angiography, etc. It may be suitable to use this semiconductor X-ray detector 100 in place of a photographic plate, a photographic film, a PSP plate, an X-ray image intensifier, a scintillator, or another semiconductor X-ray detector.

Figure 16A:
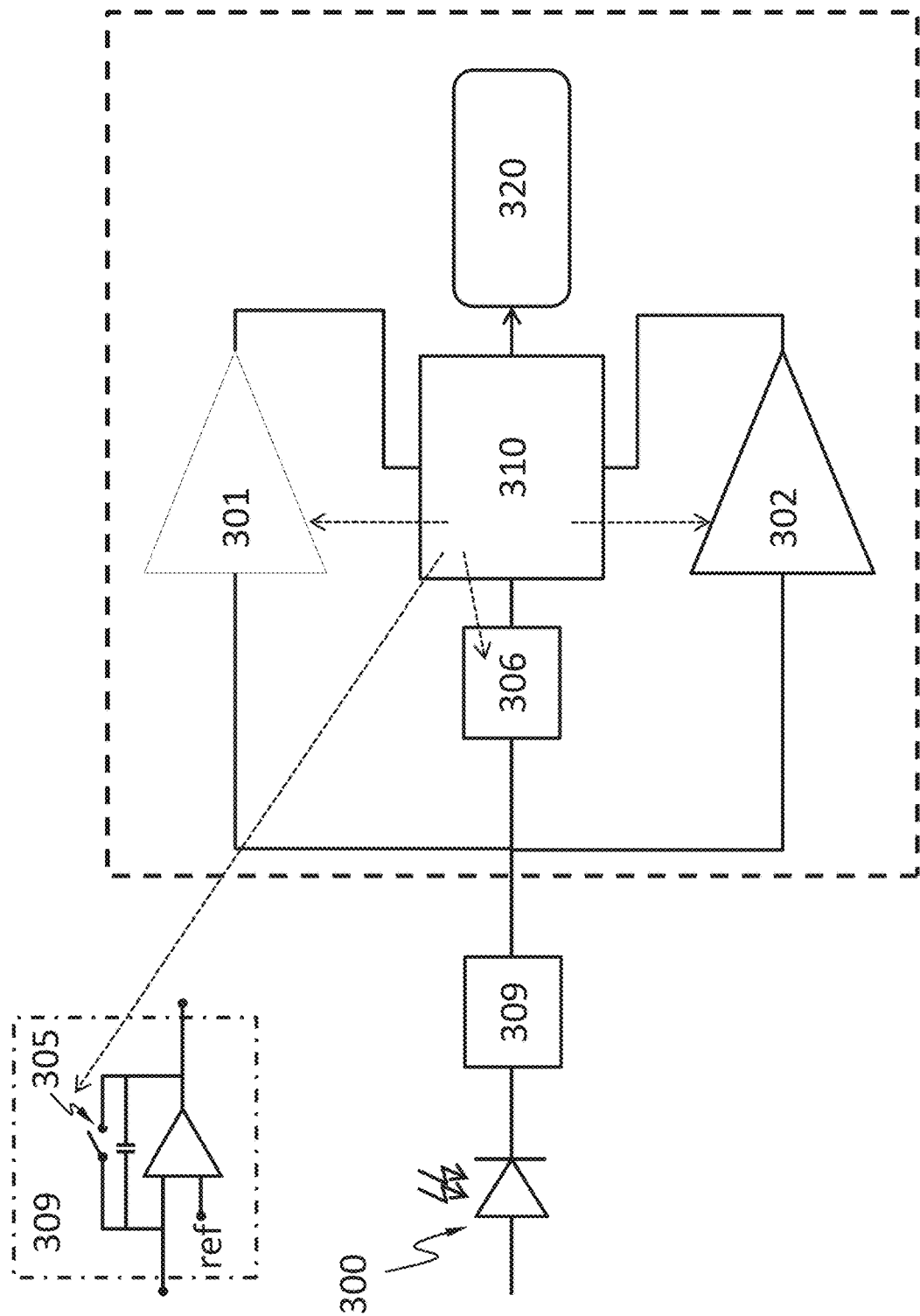
FIG. 16A and FIG. 16B each show a component diagram of an electronic system of the detector in FIG. 1A or FIG. 1B, according to an embodiment.
Figure 16B:
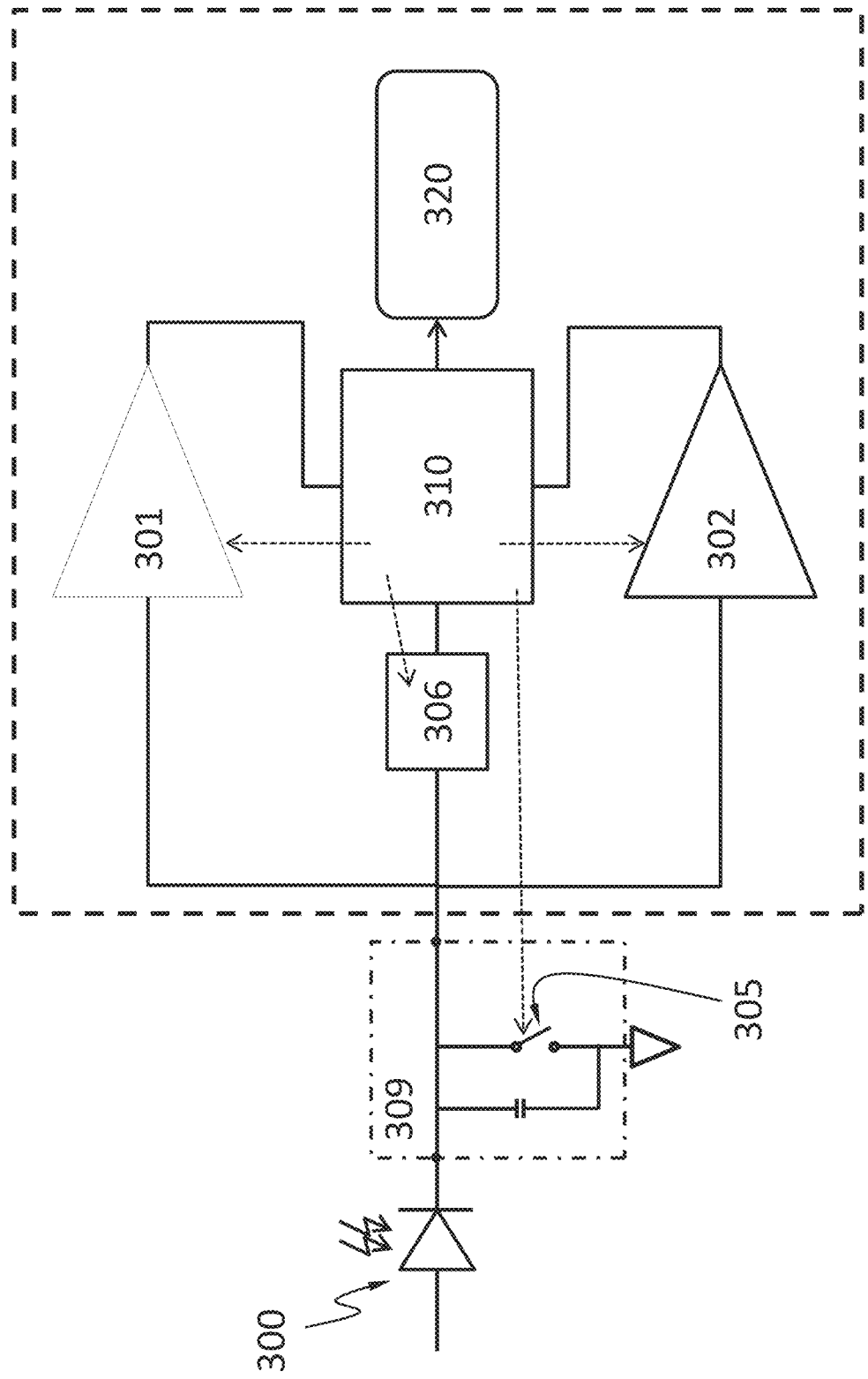

FIG. 16A and FIG. 16B each show a component diagram of the electronic system 121, according to an embodiment. The electronic system 121 may include a first voltage comparator 301, a second voltage comparator 302, a counter 320, a switch 305, a voltmeter 306 and a controller 310.

The first voltage comparator 301 is configured to compare the voltage of an electrode of a diode 300 to a first threshold. The diode may be a diode formed by the first doped region 111, one of the discrete regions 114 of the second doped region 113, and the optional intrinsic region 112. Alternatively, the first voltage comparator 301 is configured to compare the voltage of an electrical contact (e.g., a discrete portion of electrical contact 119B) to a first threshold. The first voltage comparator 301 may be configured to monitor the voltage directly, or calculate the voltage by integrating an electric current flowing through the diode or electrical contact over a period of time. The first voltage comparator 301 may be controllably activated or deactivated by the controller 310. The first voltage comparator 301 may be a continuous comparator. Namely, the first voltage comparator 301 may be configured to be activated continuously, and monitor the voltage continuously. The first voltage comparator 301 configured as a continuous comparator reduces the chance that the system 121 misses signals generated by an incident X-ray photon. The first voltage comparator 301 configured as a continuous comparator is especially suitable when the incident X-ray intensity is relatively high. The first voltage comparator 301 may be a clocked comparator, which has the benefit of lower power consumption. The first voltage comparator 301 configured as a clocked comparator may cause the system 121 to miss signals generated by some incident X-ray photons. When the incident X-ray intensity is low, the chance of missing an incident X-ray photon is low because the time interval between two successive photons is relatively long. Therefore, the first voltage comparator 301 configured as a clocked comparator is especially suitable when the incident X-ray intensity is relatively low. The first threshold may be 5-10%, 10%-20%, 20-30%, 30-40% or 40-50% of the maximum voltage one incident X-ray photon may generate in the diode or the resistor. The maximum voltage may depend on the energy of the incident X-ray photon (i.e., the wavelength of the incident X-ray), the material of the X-ray absorption layer 110, and other factors. For example, the first threshold may be 50 mV, 100 mV, 150 mV, or 200 mV.

The second voltage comparator 302 is configured to compare the voltage to a second threshold. The second voltage comparator 302 may be configured to monitor the voltage directly, or calculate the voltage by integrating an electric current flowing through the diode or the electrical contact over a period of time. The second voltage comparator 302 may be a continuous comparator. The second voltage comparator 302 may be controllably activate or deactivated by the controller 310. When the second voltage comparator 302 is deactivated, the power consumption of the second voltage comparator 302 may be less than 1%, less than 5%, less than 10% or less than 20% of the power consumption when the second voltage comparator 302 is activated. The absolute value of the second threshold is greater than the absolute value of the first threshold. As used herein, the term "absolute value" or "modulus" |x| of a real number x is the non-negative value of x without regard to its sign. Namely, $$|x| = \begin{cases} x, \text{if } x \geq 0 \\ -x, \text{if } x \leq 0 \end{cases}.$$

The second threshold may be 200%-300% of the first threshold. The second threshold may be at least 50% of the maximum voltage one incident X-ray photon may generate in the diode or resistor. For example, the second threshold may be 100 mV, 150 mV, 200 mV, 250 mV or 300 mV. The second voltage comparator 302 and the first voltage comparator 310 may be the same component. Namely, the system 121 may have one voltage comparator that can compare a voltage with two different thresholds at different times.

The first voltage comparator 301 or the second voltage comparator 302 may include one or more op-amps or any other suitable circuitry. The first voltage comparator 301 or the second voltage comparator 302 may have a high speed to allow the system 121 to operate under a high flux of incident X-ray. However, having a high speed is often at the cost of power consumption.

The counter 320 is configured to register a number of X-ray photons reaching the diode or resistor. The counter 320 may be a software component (e.g., a number stored in a computer memory) or a hardware component (e.g., a 4017 IC and a 7490 IC).

The controller 310 may be a hardware component such as a microcontroller and a microprocessor. The controller 310 is configured to start a time delay from a time at which the first voltage comparator 301 determines that the absolute value of the voltage equals or exceeds the absolute value of the first threshold (e.g., the absolute value of the voltage increases from below the absolute value of the first threshold to a value equal to or above the absolute value of the first threshold). The absolute value is used here because the voltage may be negative or positive, depending on whether the voltage of the cathode or the anode of the diode or which electrical contact is used. The controller 310 may be configured to keep deactivated the second voltage comparator 302, the counter 320 and any other circuits the operation of the first voltage comparator 301 does not require, before the time at which the first voltage comparator 301 determines that the absolute value of the voltage equals or exceeds the absolute value of the first threshold. The time delay may expire before or after the voltage becomes stable, i.e., the rate of change of the voltage is substantially zero. The phase "the rate of change of the voltage is substantially zero" means that temporal change of the voltage is less than 0.1%/ns. The phase "the rate of change of the voltage is substantially non-zero" means that temporal change of the voltage is at least 0.1%/ns.

The controller 310 may be configured to activate the second voltage comparator during (including the beginning and the expiration) the time delay. In an embodiment, the controller 310 is configured to activate the second voltage comparator at the beginning of the time delay. The term "activate" means causing the component to enter an operational state (e.g., by sending a signal such as a voltage pulse or a logic level, by providing power, etc.). The term "deactivate" means causing the component to enter a non-operational state (e.g., by sending a signal such as a voltage pulse or a logic level, by cut off power, etc.). The operational state may have higher power consumption (e.g., 10 times higher, 100 times higher, 1000 times higher) than the non-operational state. The controller 310 itself may be deactivated until the output of the first voltage comparator 301 activates the controller 310 when the absolute value of the voltage equals or exceeds the absolute value of the first threshold.

The controller 310 may be configured to cause the number registered by the counter 320 to increase by one, if, during the time delay, the second voltage comparator 302 determines that the absolute value of the voltage equals or exceeds the absolute value of the second threshold.

The controller 310 gray be configured to cause the voltmeter 306 to measure the voltage upon expiration of the time delay. The controller 310 may be configured to connect the electrode to an electrical ground, so as to reset the voltage and discharge any charge carriers accumulated on the electrode. In an embodiment, the electrode is connected to an electrical ground after the expiration of the time delay. In an embodiment, the electrode is connected to an electrical ground for a finite reset time period. The controller 310 may connect the electrode to the electrical ground by controlling the switch 305. The switch may be a transistor such as a field-effect transistor (FET).

In an embodiment, the system 121 has no analog filter network (e.g., a RC network). In an embodiment, the system 121 has no analog circuitry.

The voltmeter 306 may feed the voltage it measures to the controller 310 as an analog or digital signal.

The system 121 may include a capacitor module 309 electrically connected to the electrode of the diode 300 or which electrical contact, wherein the capacitor module is configured to collect charge carriers from the electrode. The capacitor module can include a capacitor in the feedback path of an amplifier. The amplifier configured as such is called a capacitive transimpedance amplifier (CTIA). CTIA has high dynamic range by keeping the amplifier from saturating and improves the signal-to-noise ratio by limiting the bandwidth in the signal path. Charge carriers from the electrode accumulate on the capacitor over a period of time ("integration period") (e.g., as shown FIG. 17, between $t_0$ to $t_1$, or $t_1$-$t_2$). After the integration period has expired, the capacitor voltage is sampled and then reset by a reset switch. The capacitor module can include a capacitor directly connected to the electrode.

Figure 17:
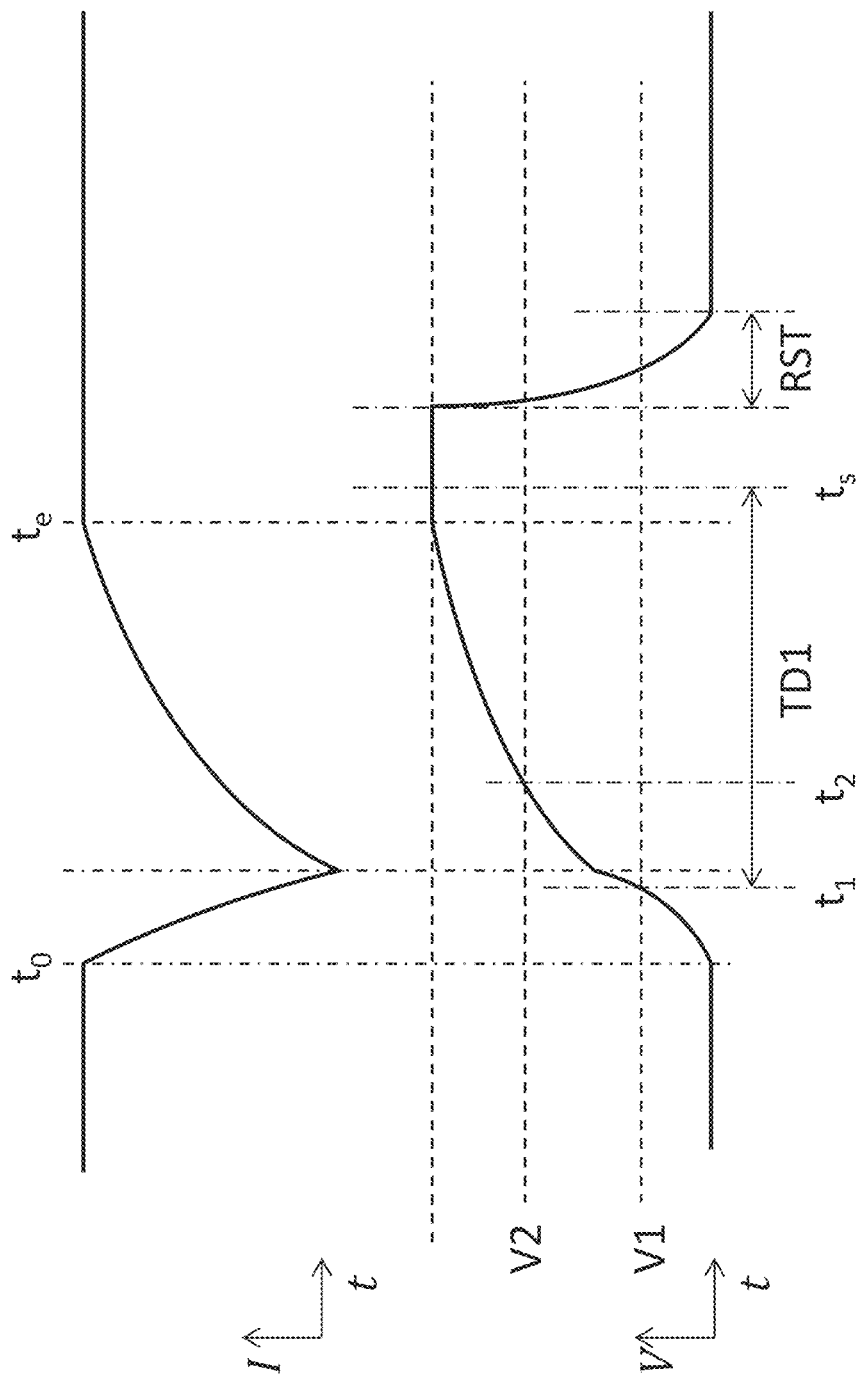
FIG. 17 schematically shows a temporal change of the electric current flowing through an electrode (upper curve) of a diode or an electrical contact of a resistor of an X-ray absorption layer exposed to X-ray, the electric current caused by charge carriers generated by an X-ray photon incident on the X-ray absorption layer, and a corresponding temporal change of the voltage of the electrode (lower curve), according to an embodiment.

FIG. 17 schematically shows a temporal change of the electric current flowing through the electrode (upper curve) caused by charge carriers generated by an X-ray photon incident on the diode or the resistor, and a corresponding temporal change of the voltage of the electrode (lower curve). The voltage may be an integral of the electric current with respect to time. At time $t_0$, the X-ray photon hits the diode or the resistor, charge carriers start being generated in the diode or the resistor, electric current starts to flow through the electrode of the diode or the resistor, and the absolute value of the voltage of the electrode or electrical contact starts to increase. At time $t_1$, the first voltage comparator 301 determines that the absolute value of the voltage equals or exceeds the absolute value of the first threshold V1, and the controller 310 starts the time delay TD1 and the controller 310 may deactivate the first voltage comparator 301 at the beginning of TD1. If the controller 310 is deactivated before $t_1$, the controller 310 is activated at $t_1$. During TD1, the controller 310 activates the second voltage comparator 302. The term "during" a time delay as used here means the beginning and the expiration (i.e., the end) and any time in between. For example, the controller 310 may activate the second voltage comparator 302 at the expiration of TD1. If during TD1, the second voltage comparator 302 determines that the absolute value of the voltage equals or exceeds the absolute value of the second threshold at time $t_2$, the controller 310 causes the number registered by the counter 320 to increase by one. At time $t_e$, all charge carriers generated by the X-ray photon drift out of the X-ray absorption layer 110. At time $t_s$, the time delay TD1 expires. In the example of FIG. 17, time $t_s$ is after time $t_e$; namely TD1 expires after all charge carriers generated by the X-ray photon drift out of the X-ray absorption layer 110. The rate of change of the voltage is thus substantially zero at $t_s$. The controller 310 may be configured to deactivate the second voltage comparator 302 at expiration of TD1 or at $t_2$, or any time in between.

The controller 310 may be configured to cause the voltmeter 306 to measure the voltage upon expiration of the time delay TD1. In an embodiment, the controller 310 causes the voltmeter 306 to measure the voltage after the rate of change of the voltage becomes substantially zero after the expiration of the time delay TD1. The voltage at this moment is proportional to the amount of charge carriers generated by an X-ray photon, which relates to the energy of the X-ray photon. The controller 310 may be configured to determine the energy of the X-ray photon based on voltage the voltmeter 306 measures. One way to determine the energy is by binning the voltage. The counter 320 may have a sub-counter for each bin. When the controller 310 determines that the energy of the X-ray photon falls in a bin, the controller 310 may cause the number registered in the sub-counter for that bin to increase by one. Therefore, the system 121 may be able to detect an X-ray image and may be able to resolve X-ray photon energies of each X-ray photon.

After TD1 expires, the controller 310 connects the electrode to an electric ground for a reset period RST to allow charge carriers accumulated on the electrode to flow to the ground and reset the voltage. After RST, the system 121 is ready to detect another incident X-ray photon. Implicitly, the rate of incident X-ray photons the system 121 can handle in the example of FIG. 17 is limited by 1/(TD1+RST). If the first voltage comparator 301 has been deactivated, the controller 310 can activate it at any time before RST expires. If the controller 310 has been deactivated, it may be activated before RST expires.

Figure 18:
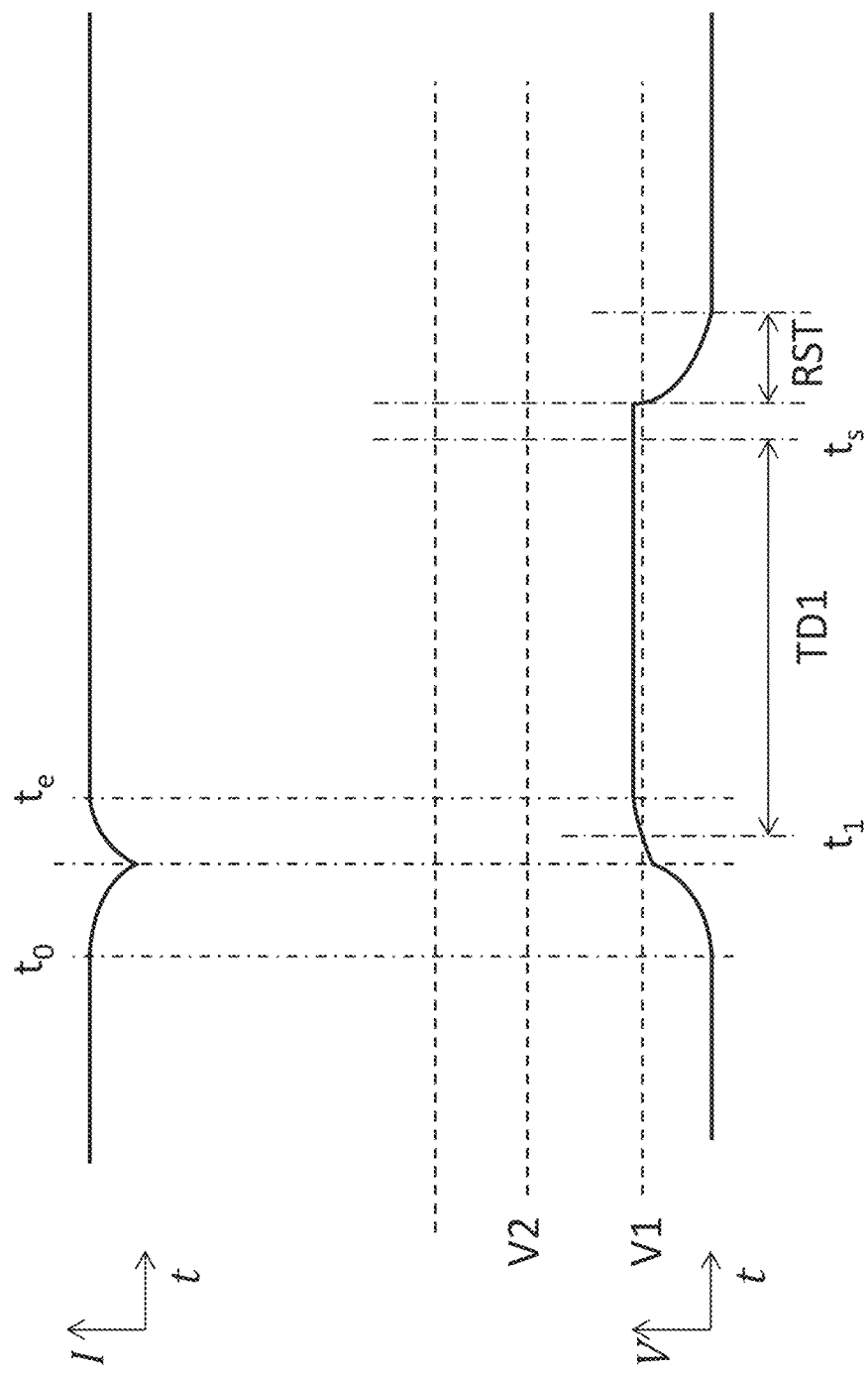
FIG. 18 schematically shows a temporal change of the electric current flowing through the electrode (upper curve) caused by noise (e.g., dark current), and a corresponding temporal change of the voltage of the electrode (lower curve), in the electronic system operating in the way shown in FIG. 8, according to an embodiment.

FIG. 18 schematically shows a temporal change of the electric current flowing through the electrode (upper curve) caused by noise (e.g., dark current, background radiation, scattered X-rays, fluorescent X-rays, shared charges from adjacent pixels), and a corresponding temporal change of the voltage of the electrode (lower curve), in the system 121 operating in the way shown in FIG. 17. At time $t_0$, the noise begins. If the noise is not large enough to cause the absolute value of the voltage to exceed the absolute value of V1, the controller 310 does not activate the second voltage comparator 302. If the noise is large enough to cause the absolute value of the voltage to exceed the absolute value of V1 at time $t_1$ as determined by the first voltage comparator 301, the controller 310 starts the time delay TD1 and the controller 310 may deactivate the first voltage comparator 301 at the beginning of TD1. During TD1 (e.g., at expiration of TD1), the controller 310 activates the second voltage comparator 302. The noise is very unlikely large enough to cause the absolute value of the voltage to exceed the absolute value of V2 during TD1. Therefore, the controller 310 does not cause the number registered by the counter 320 to increase. At time $t_e$, the noise ends. At time $t_s$, the time delay TD1 expires. The controller 310 may be configured to deactivate the second voltage comparator 302 at expiration of TD1. The controller 310 may be configured not to cause the voltmeter 306 to measure the voltage if the absolute value of the voltage does not exceed the absolute value of V2 during TD1. After TD1 expires, the controller 310 connects the electrode to an electric ground for a reset period RST to allow charge carriers accumulated on the electrode as a result of the noise to flow to the ground and reset the voltage. Therefore, the system 121 may be very effective in noise rejection.

Figure 19:
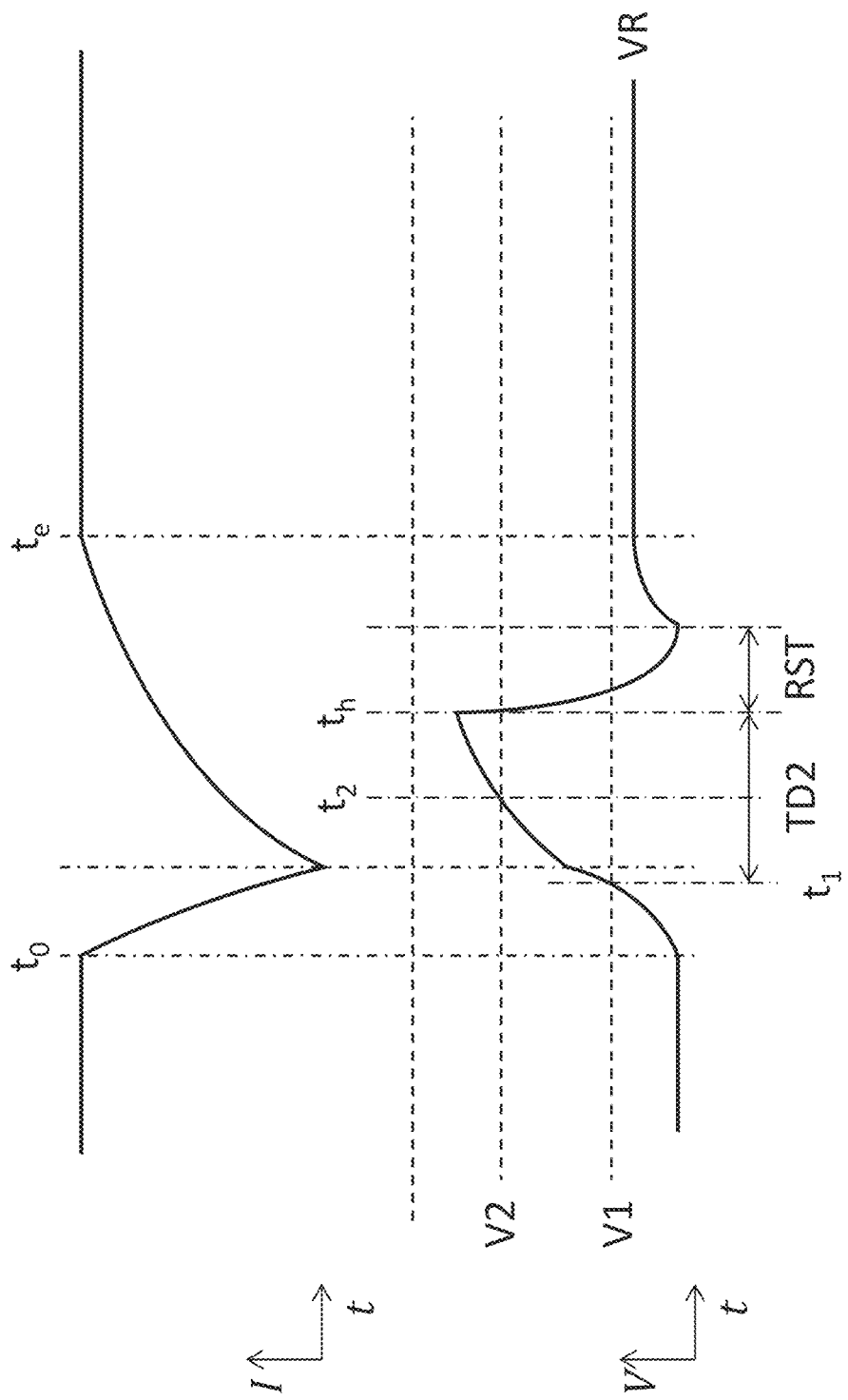
FIG. 19 schematically shows a temporal change of the electric current flowing through an electrode (upper curve) of the X-ray absorption layer exposed to X-ray, the electric current caused by charge carriers generated by an X-ray photon incident on the X-ray absorption layer, and a corresponding temporal change of the voltage of the electrode (lower curve), when the electronic system operates to detect incident X-ray photons at a higher rate, according to an embodiment.

FIG. 19 schematically shows a temporal change of the electric current flowing through the electrode (upper curve) caused by charge carriers generated by an X-ray photon incident on the diode or the resistor, and a corresponding temporal change of the voltage of the electrode (lower curve), when the system 121 operates to detect incident X-ray photons at a rate higher than 1/(TD1+RST). The voltage may be an integral of the electric current with respect to time. At time $t_0$, the X-ray photon hits the diode or the resistor, charge carriers start being generated in the diode or the resistor, electric current starts to flow through the electrode of the diode or the electrical contact of resistor, and the absolute value of the voltage of the electrode or the electrical contact starts to increase. At time $t_1$, the first voltage comparator 301 determines that the absolute value of the voltage equals or exceeds the absolute value of the first threshold V1, and the controller 310 starts a time delay TD2 shorter than TD1, and the controller 310 may deactivate the first voltage comparator 301 at the beginning of TD2. If the controller 310 is deactivated before $t_1$, the controller 310 is activated at $t_1$. During TD2 (e.g., at expiration of TD2), the controller 310 activates the second voltage comparator 302. If during TD2, the second voltage comparator 302 determines that the absolute value of the voltage equals or exceeds the absolute value of the second threshold at time $t_2$, the controller 310 causes the number registered by the counter 320 to increase by one. At time $t_e$, all charge carriers generated by the X-ray photon drift out of the X-ray absorption layer 110. At time $t_h$, the time delay TD2 expires. In the example of FIG. 19, time $t_h$ is before time $t_e$; namely TD2 expires before all charge carriers generated by the X-ray photon drift out of the X-ray absorption layer 110. The rate of change of the voltage is thus substantially non-zero at $t_h$. The controller 310 may be configured to deactivate the second voltage comparator 302 at expiration of TD2 or at $t_2$, or any time in between.

The controller 310 may be configured to extrapolate the voltage at $t_e$ from the voltage as a function of time during TD2 and use the extrapolated voltage to determine the energy of the X-ray photon.

After TD2 expires, the controller 310 connects the electrode to an electric ground for a reset period RST to allow charge carriers accumulated on the electrode to flow to the ground and reset the voltage. In an embodiment, RST expires before $t_e$. The rate of change of the voltage after RST may be substantially non-zero because all charge carriers generated by the X-ray photon have not drifted out of the X-ray absorption layer 110 upon expiration of RST before $t_e$. The rate of change of the voltage becomes substantially zero after $t_e$ and the voltage stabilized to a residue voltage VR after $t_e$. In an embodiment, RST expires at or after $t_e$, and the rate of change of the voltage after RST may be substantially zero because all charge carriers generated by the X-ray photon drift out of the X-ray absorption layer 110 at $t_e$. After RST, the system 121 is ready to detect another incident X-ray photon. If the first voltage comparator 301 has been deactivated, the controller 310 can activate it at any time before RST expires. If the controller 310 has been deactivated, it may be activated before RST expires.

Figure 20:
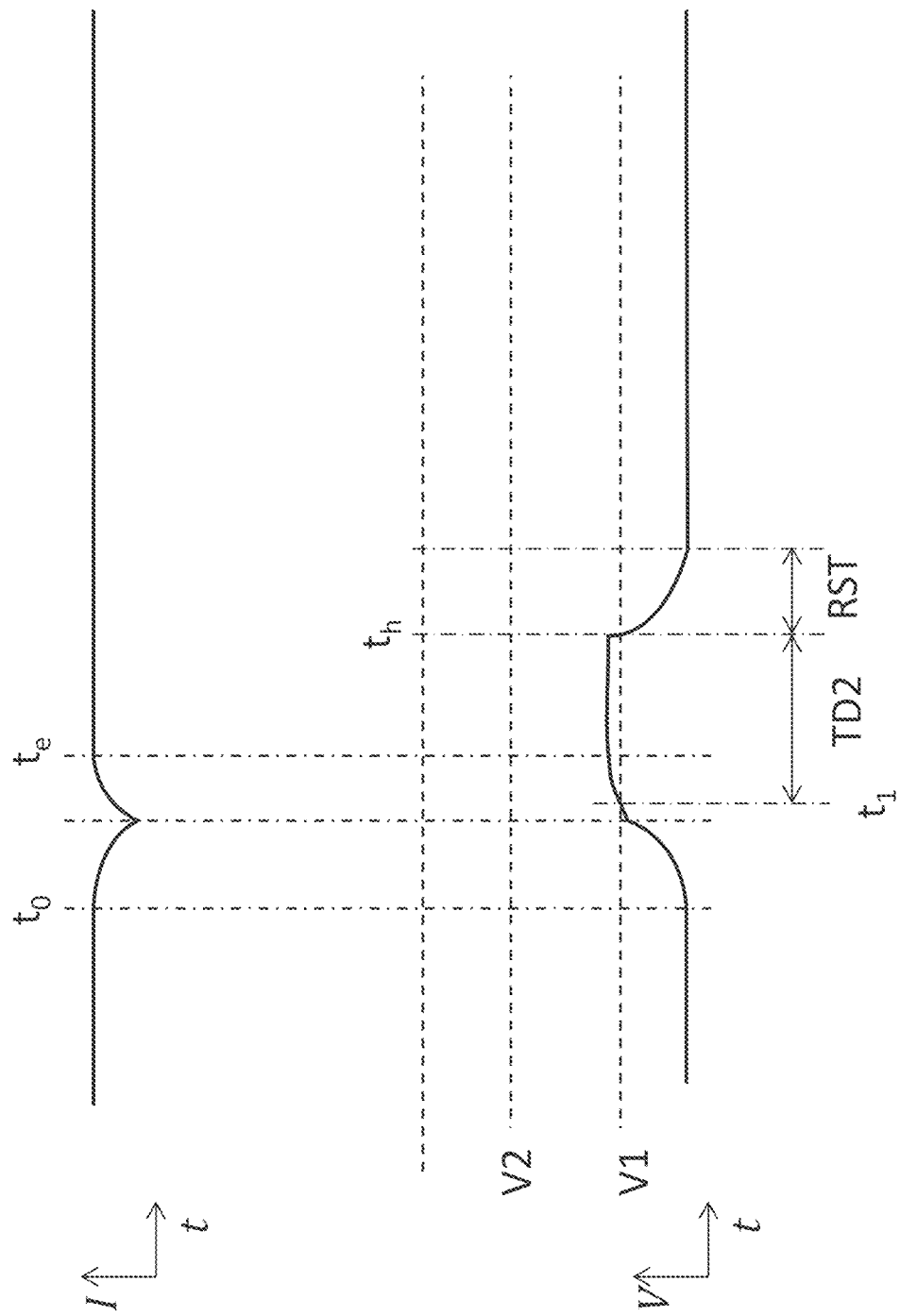
FIG. 20 schematically shows a temporal change of the electric current flowing through the electrode (upper curve) caused by noise (e.g., dark current), and a corresponding temporal change of the voltage of the electrode (lower curve), in the electronic system operating in the way shown in FIG. 10, according to an embodiment.

FIG. 20 schematically shows a temporal change of the electric current flowing through the electrode (upper curve) caused by noise (e.g., dark current, background radiation, scattered X-rays, fluorescent X-rays, shared charges from adjacent pixels), and a corresponding temporal change of the voltage of the electrode (lower curve), in the system 121 operating in the way shown in FIG. 19. At time $t_0$, the noise begins. If the noise is not large enough to cause the absolute value of the voltage to exceed the absolute value of V1, the controller 310 does not activate the second voltage comparator 302. If the noise is large enough to cause the absolute value of the voltage to exceed the absolute value of V1 at time $t_1$ as determined by the first voltage comparator 301, the controller 310 starts the time delay TD2 and the controller 310 may deactivate the first voltage comparator 301 at the beginning of TD2. During TD2 (e.g., at expiration of TD2), the controller 310 activates the second voltage comparator 302. The noise is very unlikely large enough to cause the absolute value of the voltage to exceed the absolute value of V2 during TD2. Therefore, the controller 310 does not cause the number registered by the counter 320 to increase. At time $t_e$, the noise ends. At time $t_h$, the time delay TD2 expires. The controller 310 may be configured to deactivate the second voltage comparator 302 at expiration of TD2. After TD2 expires, the controller 310 connects the electrode to an electric ground for a reset period RST to allow charge carriers accumulated on the electrode as a result of the noise to flow to the ground and reset the voltage. Therefore, the system 121 may be very effective in noise rejection.

Figure 21:
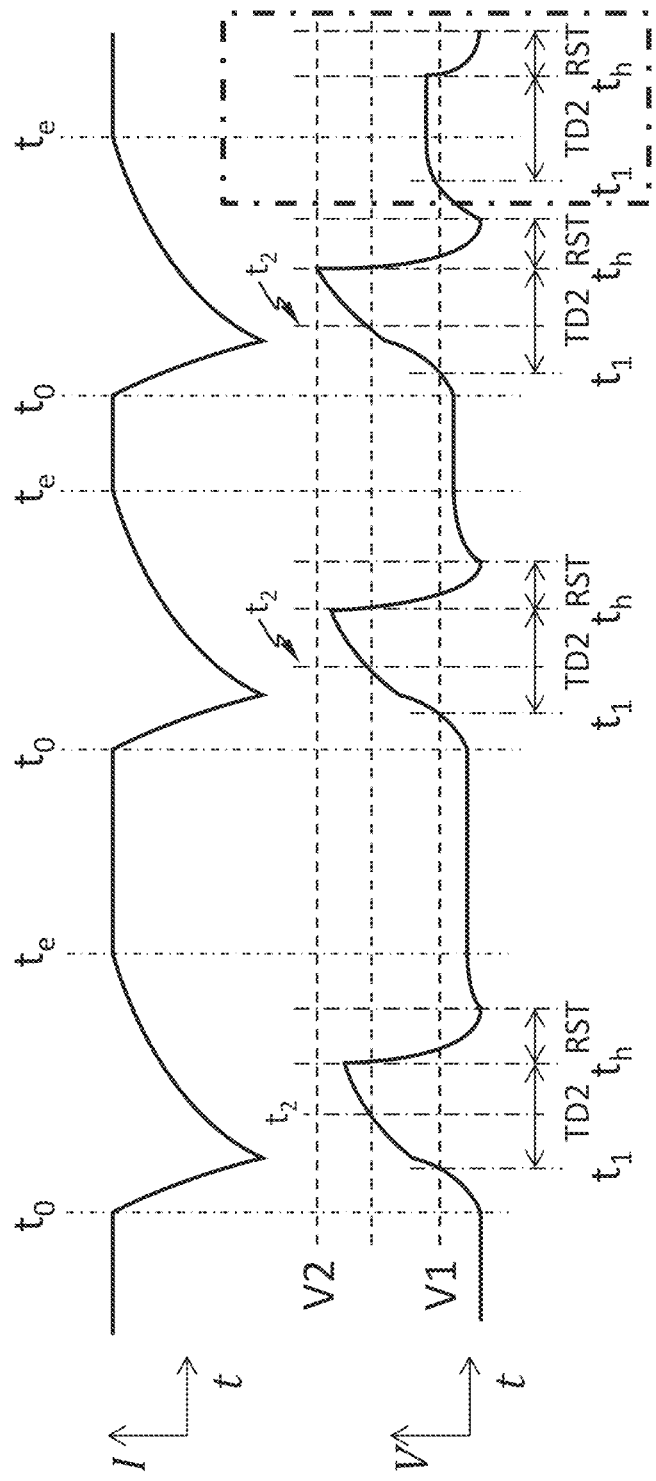
FIG. 21 schematically shows a temporal change of the electric current flowing through the electrode (upper curve) caused by charge carriers generated by a series of X-ray photons incident on the X-ray absorption layer, and a corresponding temporal change of the voltage of the electrode, in the electronic system operating in the way shown in FIG. 10 with RST expires before $t_e$, according to an embodiment.

FIG. 21 schematically shows a temporal change of the electric current flowing through the electrode (upper curve) caused by charge carriers generated by a series of X-ray photons incident on the diode or the resistor, and a corresponding temporal change of the voltage of the electrode (lower curve), in the system 121 operating in the way shown in FIG. 19 with RST expires before $t_e$. The voltage curve caused by charge carriers generated by each incident X-ray photon is offset by the residue voltage before that photon. The absolute value of the residue voltage successively increases with each incident photon. When the absolute value of the residue voltage exceeds V1 (see the dotted rectangle in FIG. 21), the controller starts the time delay TD2 and the controller 310 may deactivate the first voltage comparator 301 at the beginning of TD2. If no other X-ray photon incidence on the diode or the resistor during TD2, the controller connects the electrode to the electrical ground during the reset time period RST at the end of TD2, thereby resetting the residue voltage. The residue voltage thus does not cause an increase of the number registered by the counter 320.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method for making an apparatus suitable for detecting X-ray, the method comprising:
   bonding a plurality of chips to a substrate;
   wherein the substrate comprises an X-ray absorption layer comprising a first plurality of electrical contacts;
   wherein each of the plurality of chips comprises an electronic layer comprising a second plurality of electrical contacts and an electronic system configured to process or interpret signals generated by X-ray photons incident on the X-ray absorption layer;
   aligning the first plurality of electrical contacts to the second plurality of electrical contacts;
   mounting the chips to the substrate such that the first plurality of electrical contacts are electrically connected to the second plurality of electrical contacts;
   wherein the second plurality of electrical contacts are configured to feed the signals to the electronic system.

2. The method of claim 1, further comprising attaching the plurality of chips to a support wafer.

3. The method of claim 2, wherein the plurality of chips are attached to the support wafer with an adhesive.

4. The method of claim 2, wherein the plurality of chips are attached to the support wafer after the plurality of chips are mounted to the substrate.

5. The method of claim 2, wherein the plurality of chips are mounted to a second substrate.

6. The method of claim 2, further comprising removing the support wafer.

7. The method of claim 6, wherein removing the support wafer comprises grinding or etching the support wafer.

8. The method of claim 1, further comprising encapsulating the plurality of chips in a matrix.

9. The method of claim 8, wherein the matrix comprises a polymer or glass.

10. The method of claim 8, wherein the matrix fills gaps between the chips.

11. The method of claim 8, further comprising exposing a surface of each of the chips.

12. The method of claim 11, wherein mounting the chips to the substrate comprises mounting the chips encapsulated in the matrix.

13. The method of claim 1, wherein the electronic layer comprises vias extending to a surface opposite to the X-ray absorption layer.

14. The method of claim 13, further comprising aligning the vias to contact pads on an interposer substrate, and bonding the chips to the interposer substrate such that the vias are electrically connected to the contact pads.

15. The method of claim 14, wherein the interposer substrate comprises transmission lines electrically connected to the contact pads and configured to route a signal on the contact pads to bonding pads on an edge of the interposer substrate.

16. The method of claim 15, further comprising mounting the interposer substrate to a printed circuit board or positioning the interposer substrate side-by-side with a printed circuit board.

17. The method of claim 1, wherein the electronic layer comprises a third plurality of electrical contacts configured to read output from the electronic system or to provide power or a reference voltage to the electronic system.

18. The method of claim 17, wherein the X-ray absorption layer comprises a fourth plurality of electrical contacts configured to connect with the third electrical contacts when the chips are mounted to the substrate.

19. The method of claim 18, wherein the X-ray absorption layer further comprises transmission lines configured to route a signal at the fourth plurality of electrical contacts to bonding pads on the X-ray absorption layer.

\* \* \* \* \*